(12) United States Patent
Vella et al.

(10) Patent No.: US 11,957,059 B2
(45) Date of Patent: Apr. 9, 2024

(54) ELECTRICAL COMPONENT

(71) Applicant: Xaar Technology Limited, Cambridge (GB)

(72) Inventors: Andrew Vella, Cambridge (GB); Peter Mardilovich, Cambridge (GB)

(73) Assignee: XAAR TECHNOLOGY LIMITED, Cambridge (GB)

(*) Notice: Subject to any disclaimer, the term of this patent is extended or adjusted under 35 U.S.C. 154(b) by 474 days.

(21) Appl. No.: 17/294,152

(22) PCT Filed: Nov. 15, 2019

(86) PCT No.: PCT/GB2019/053249
§ 371 (c)(1),
(2) Date: May 14, 2021

(87) PCT Pub. No.: WO2020/099891
PCT Pub. Date: May 22, 2020

(65) Prior Publication Data
US 2022/0006000 A1   Jan. 6, 2022

(30) Foreign Application Priority Data

Nov. 15, 2018   (GB) ..................................... 1818644

(51) Int. Cl.
*H01L 41/053*   (2006.01)
*B41J 2/14*   (2006.01)
(Continued)

(52) U.S. Cl.
CPC ........ *H10N 30/883* (2023.02); *B41J 2/14201* (2013.01); *B41J 2/1623* (2013.01);
(Continued)

(58) Field of Classification Search
CPC ............ B81B 2201/057; B81B 3/0021; B81B 2203/04; H10N 30/10516; H10N 30/883
See application file for complete search history.

(56) References Cited

U.S. PATENT DOCUMENTS

| 8,322,830 B2 | 12/2012 | Takakuwa |
| 11,770,976 B2 * | 9/2023 | Vella ..................... B41J 2/1643 347/72 |

(Continued)

FOREIGN PATENT DOCUMENTS

| EP | 3213923 A1 | 9/2017 |
| JP | 2008244266 A | 10/2008 |

(Continued)

OTHER PUBLICATIONS

Search Report dated Apr. 5, 2019, in the corresponding United Kingdom Application No. 1818644.5.

(Continued)

*Primary Examiner* — Jaehwan Oh
(74) *Attorney, Agent, or Firm* — Honigman LLP; Eric J. Sosenko; Jonathan P. O'Brien

(57) ABSTRACT

The present invention relates to an electrical component for a microelectromechanical systems (MEMS) device, in particular, but not limited to, an electromechanical actuator. In one aspect, the present invention provides an insulated electrical component for a microelectromechanical systems device comprising: i) a substrate layer comprising first and second sides spaced apart in a thickness direction; ii) one or more electrical elements arranged over the first side of the substrate layer, wherein each of the one or more electrical elements comprises: a) a ceramic member; and b) first and second electrodes disposed adjacent the ceramic member such that a potential difference may be established between the first and second electrodes and through the ceramic member during operation; iii) a continuous insulating layer, (Continued)

or laminate of insulating layers, arranged to overlie each of the one or more electrical elements arranged on the first side of the substrate layer; and iv) a passivation layer, or laminate of multiple passivation layers, disposed adjacent to, and at least partially overlying, each of the one or more electrical elements so as to provide electrical passivation between the first and second electrodes of each of the one or more electrical elements; wherein: a) the passivation layer, or at least an innermost layer of the laminate of multiple passivation layers which is disposed adjacent each of the one or more underlying electrical elements, is discontinuous; and/or b) the laminate of multiple passivation layers is recessed at a side which faces away from each of the underlying electrical elements, wherein a recess is provided in a region overlying each of the one or more electrical elements, such that the laminate of passivation layers is thinner in a thickness direction across the recess compared to other non-recessed regions of the laminate of passivation layers.

20 Claims, 12 Drawing Sheets

(51) Int. Cl.
  *B41J 2/16* (2006.01)
  *B81B 3/00* (2006.01)
  *H10N 30/00* (2023.01)
  *H10N 30/20* (2023.01)
  *H10N 30/853* (2023.01)
  *H10N 30/87* (2023.01)
  *H10N 30/88* (2023.01)

(52) U.S. Cl.
  CPC .......... *B41J 2/1628* (2013.01); *B81B 3/0021* (2013.01); *H10N 30/10516* (2023.02); *H10N 30/2047* (2023.02); *H10N 30/8554* (2023.02); *H10N 30/8561* (2023.02); *H10N 30/871* (2023.02); *B81B 2201/057* (2013.01); *B81B 2203/04* (2013.01)

(56) References Cited

U.S. PATENT DOCUMENTS

| | | |
|---|---|---|
| 2010/0221497 A1 | 9/2010 | Nayve et al. |
| 2015/0283811 A1* | 10/2015 | Kondo ................ H10N 30/204 29/25.35 |
| 2016/0043299 A1* | 2/2016 | Fujimori ............ H10N 30/2047 29/25.35 |
| 2017/0253039 A1 | 9/2017 | Kimura et al. |
| 2017/0334205 A1* | 11/2017 | Mizukami .............. H10N 30/20 |
| 2018/0194134 A1 | 7/2018 | Kawakubo et al. |
| 2022/0006001 A1* | 1/2022 | Vella ..................... B41J 2/1646 |

FOREIGN PATENT DOCUMENTS

| | | |
|---|---|---|
| JP | 2010240830 A | 10/2010 |
| JP | 2016054200 A | 4/2014 |
| JP | 2018154121 A | 10/2018 |

OTHER PUBLICATIONS

International Search Report dated May 8, 2020, in International Application No. PCT/GB2019/053249.

* cited by examiner (f)

(g)

(h)

(l)

(m)

(n)

(o)

ELECTRICAL COMPONENT

CROSS REFERENCE TO RELATED APPLICATIONS

This application is a national stage entry of international application no. PCT/GB2019/053249, filed Nov. 15, 2019, which is based on and claims the benefit of foreign priority under 35 U.S.C. 119 to GB 1818644.5, filed Nov. 15, 2018. Where permissible, the entire contents of the above-referenced applications are herein expressly incorporated by reference.

The present invention relates to an electrical component for a microelectromechanical systems (MEMS) device, in particular, but not limited to, an electromechanical actuator. It may find particularly beneficial application as an actuator element for a droplet deposition head.

Droplet ejection heads are now in widespread usage, whether in more traditional applications, such as inkjet printing, or in 3D printing, or other materials deposition or rapid prototyping techniques. Accordingly, the fluids may have novel chemical properties to adhere to new substrates and increase the functionality of the deposited material.

Recently, inkjet printheads have been developed that are capable of depositing ink directly onto ceramic tiles, with high reliability and throughput. This allows the patterns on the tiles to be customized to a customer's exact specifications, as well as reducing the need for a full range of tiles to be kept in stock.

In other applications, inkjet printheads have been developed that are capable of depositing ink directly on to textiles. As with ceramics applications, this may allow the patterns on the textiles to be customized to a customer's exact specifications, as well as reducing the need for a full range of printed textiles to be kept in stock.

In still other applications, droplet deposition heads may be used to form elements such as colour filters in LCD or OLED elements displays used in flat-screen television manufacturing.

So as to be suitable for new and/or increasingly challenging deposition applications, droplet deposition heads continue to evolve and specialise. However, while a great many developments have been made, there remains room for improvements in the field of droplet deposition heads.

Electrical elements for MEMS devices are commonly manufactured through the deposition of a series of layers arranged on a substrate, for example through one or more techniques known in the thin film technology field. A typical electrical element may have a configuration where a thin film of a ceramic material showing ferroelectric behaviour, for example a piezoelectric material and a relaxor/ferroelectric crossover material, is interposed between two electrically conductive layers, a lower electrode and a top electrode. Such an electrical element is deposited layer by layer on a substrate, commonly a wafer accommodating several arrays of electrical elements.

The lower electrode may be a common electrode or may be patterned to form arrays of individual electrodes, each associated with an individual electrical element, whilst the thin film material, as well, may or may not be patterned. Individual electrical elements, therefore, might comprise a patterned ceramic material thin film or a region of an unpatterned "common" ceramic material thin film. Individually addressable regions of the electrical elements may be defined by at least one of the electrodes being patterned such as to be individual to each electrical element.

In other cases an electrical element may have an electrode configuration in which first and second electrodes are instead provided on one surface of the ceramic thin film, for example, as an adjacent or interdigitated pair. This electrode arrangement has the advantage of providing an easier way of connecting the electrodes since they are on the same surface so the manufacture of the electrical component is simplified. It is particularly useful for some applications, for example sensors.

Electrical connection of the electrical element to the drive circuitry may be ensured through the use of metal traces that are directly connected to the electrodes of the electrical element.

Commonly employed ceramic materials include lead based ceramics with perovskite structure, especially lead titanate zirconate (PZT), doped PZT and PZT based solid solutions. They may be deposited onto the substrate through a number of deposition techniques known in the art, for example, sputtering, chemical vapour deposition (CVD), chemical solution deposition (CSD).

In recent years significant effort has been put into the development of lead-free alternative materials such as $(K,Na)NbO_3$-based materials, $(Ba,Ca)(Zr,Ti)O_3$-based materials and $(Bi,Na,K)TiO_3$-based materials.

One challenge of providing a reliable electrical element is to ensure proper passivation between the electrodes of individual electrical elements, protection of the individual piezoelectric members and insulation of an electrical component, as a whole, from the external environment especially humidity and chemicals that may cause short circuits and/or corrosion and/or degradation of the electrical component which may, eventually, lead to unrecoverable failure of the electrical component.

The ceramic material typically is not a good conductor of electricity. Where for example at least the lower electrode and ceramic material are patterned to the same shape, with either a common or similarly patterned upper electrode, paths for shorts can be present along the edge profile of the patterned areas. The piezoelectric members themselves are susceptible to chemical attack that can lead to a degradation of the piezoelectric and electrical properties of the material. Moreover, etch-damaged piezoelectric members may be particularly vulnerable and offer paths for a chemical attack to diffuse further internally in the piezoelectric member. This necessitates the use of additional, electrically passivating layers that ensure electric isolation between the two electrodes and at the same time protection of the piezoelectric member.

Therefore, one or more passivation layers may be deposited on at least part of the electrical element. Adequate protection of the electrical element must be balanced with the inhibitive effect of such passivation layers on the performance of the electrical element, particularly the extent of the displacement of electrostrictive/piezoelectric components of electrical elements. This is particularly relevant when the passivation extends on the whole electrical element. Thicker passivation layers perform well in providing electric passivation, but can more readily suppress the electrostrictive/piezoelectric performance. Meanwhile, thinner passivation layers may not provide adequate protection.

As is well known to the skilled person, commonly used methods of deposition of passivation coatings very rarely produce defect-free layers. Moreover, residual stress determined by the nature of the material and the method of deposition may be responsible for localised micro-cracks in any of the passivation layers. Once again, thicker layers may be characterised by a lower density of defects with respect to thinner layers but they have a negative impact on the displacement of the electrical element.

Moreover, in the process for the manufacture of the electrical component, including the one or more electrical elements thereof, manufacturing steps requiring the use of etchants may be necessary.

During operation, as well, many different kinds of fluids, including moisture, may be present in a device where the electrical component is being used. There is a possibility, therefore, of the electrical component coming into contact with chemicals during the manufacturing steps and/or during operation. Furthermore there may be humidity and/or harmful chemicals present in the external environment during manufacture and/or during operation.

To protect the electrical component from the external environment and from chemicals, electrical components known in the art may be provided with a capping layer bonded to the substrate on the same side upon which one or more electrical elements are formed. The capping layer may be adapted to enclose each electrical element, after the deposition of the passivation structure, and to protect it from the external environment. For example a capping layer may have cavities which may be formed by etching or other suitable technique, so that, once the capping layer is bonded to the electrical component, it can enclose each of the one or more electrical elements.

Unpredictable imperfections may be present in the bonding, for example a layer of bonding material, between the capping layer and the electric component where the one or more electrical elements are formed. For example, voids due to an uneven topography, pinholes or micro-cracks. Such defects may cause leaks of chemicals through the capping layer and towards the one or more electrical elements.

The problem of leaks through the bonding of the capping layer may be exacerbated by the presence of randomly distributed defects in the form of pinholes or micro-cracks in the passivation structure. Those defects may be difficult to avoid, as well as to identify and mend and they constitute weakness spots that may provide paths for chemicals to find their way to the one or more electrical elements. The contact of chemicals with the electrical features of the one or more electrical elements, may cause corrosion, shorts and, eventually, fatal failure of one or more electrical elements.

Failure of one electrical element, in an arrangement of electrical elements incorporated within the same electrical component, may lead to complete component failure, even when a continuous layer of passivation overlies the failed electrical element and the neighbouring electrical elements. A cascade of failure events may originate from the failure of a single electrical element through, for instance, the corrosion of a common passivation layer.

Historically, continuous layers of alumina, alone or in combination with other material layers, have been preferentially used for achieving passivation between electrodes of electrical elements for use in MEMs applications, particularly those comprising lead zirconate titanate (PZT) based piezoelectric components. Alumina is particularly effective in terms of protection of PZT (particularly etch-damaged PZT) from the external environment during processing and operation of the electrical component as well as in terms of adhesion to the PZT. However, alumina may be particularly susceptible to chemical attack, for example, in some environments, such as aqueous environments, and/or as a result of moisture/chemicals ingress from the external environment which may be due to non-ideal bonding of the capping layer.

Failure of individual electrical elements of an electrical component may be compensated for (e.g. by adjusting waveform to adjacent functional electrical elements) to extend device lifetime. However, this compensation to retain device functionality has historically not been possible where continuous passivation layers with a high susceptibility to chemical attack are used. This weakness may then be compounded where non-ideal bonding is present at the capping layer, which increases the likelihood of chemical attack from the external environment.

Previous solutions to the problem of providing protection from the external environment include the use of two moisture barrier layers, as described in US 2017/0253039. That document describes a MEMs device which is protected using two moisture barrier layers which are arranged over actuating elements having individual upper electrodes and a common bottom electrode arranged in a stack. The moisture barrier layers have different Young's modulus, thickness, composition and permeability to moisture.

For example, US 2017/0253039 teaches a first moisture resistant layer which is thicker than the second moisture resistant layer, has a lower Young's modulus, and is preferably composed of a polyimide. The thinner second moisture resistant layer is preferably formed of metal, which has a low diffusivity to moisture and whose relative thinness is said to allow for deformation of the piezoelectric layer of the actuating element.

US 2017/0253039 generally discloses embodiments where the first and second moisture resistant layers are continuous layers covering the regions between neighbouring actuating elements. However, the option that the moisture resistant layers are discontinuous in the regions between neighbouring actuating elements is also described (paragraph [0074]), where appropriate protection of the actuating elements from moisture may be retained where the side surface (lateral edges) of the piezoelectric layers are still covered by the moisture resistant layers.

US 2017/0253039 does not describe the use of passivation layers to ensure electrical passivation of the electrodes and also does not acknowledge any problem associated with actuating element failure resulting from chemical attack and failure of passivation layers associated with the electrical elements.

There remains a need for providing alternative insulated electrical components for MEMs devices which provide adequate protection to the electrical elements of the component from the external environment, particularly from chemical attack, whilst at the same time accommodating for the deformation of electrostrictive/piezoelectric components of the electrical elements and/or providing means for extending device lifetime, even in the case of individual electrical element failure.

The present invention is based on the use of a continuous insulating layer overlying each electrical element of an electrical component in combination with a discontinuous and/or recessed passivation layer for providing electrical passivation between electrodes of individual elements and protection of the piezoelectric members. The present invention is able to achieve the benefits of improving protection of the electrical elements from chemical attack, particularly as a result of non-ideal bonding of a capping layer, whilst enabling use of passivation layers that are particularly effective for passivation, yet which are particularly susceptible to chemical attack or the use of which is particularly cost effective and well established in the MEMS technology field even though those passivation layers may be characterised by the presence of defects. The discontinuous and/or recessed nature of the passivation layer(s) also allows for effective passivation to be achieved whilst preventing suppression of electrostrictive/piezoelectric performance and/or preventing cascading failure mechanisms through isolation of the passivation layer associated with individual electrical elements.

The present invention is capable of mitigating the detrimental effect of defects in the passivation layer(s) associated with electrical elements to provide electrical passivation between the first and second electrodes. In particular, the invention provides an outermost insulation layer that strengthens the effect of the underlying discontinuous passivation structure by carrying high chemical inertness and also providing means for substantially mending defects in the underlying passivation structure. Additionally, when the outermost insulation layer is formed as a conformal layer, the topography of the electrical component may be improved and the bonding of the capping layer may, in turn, become more reliable and less prone to defects formation. The outermost insulation layer, in other words, may reduce the number of failures of electrical components due to chemical attack. Consequently, the electrical component manufacturing process may reach higher overall yields and the reliability of the electrical component including one or more electrical elements is enhanced.

SUMMARY OF THE INVENTION

Accordingly, in a first aspect, the present invention provides an insulated electrical component for a microelectromechanical systems device comprising: i) a substrate layer comprising first and second sides spaced apart in a thickness direction; ii) one or more electrical elements arranged over the first side of the substrate layer, wherein each of the one or more electrical elements comprises: a) a ceramic member; and b) first and second electrodes disposed adjacent the ceramic member such that a potential difference may be established between the first and second electrodes and through the ceramic member during operation; iii) a continuous insulating layer, or laminate of insulating layers, arranged to overlie each of the one or more electrical elements arranged on the first side of the substrate layer; and iv) a passivation layer, or a laminate of multiple passivation layers, disposed adjacent to, and at least partially overlying, each of the one or more electrical elements so as to provide electrical passivation between the first and second electrodes of each of the one or more electrical elements; wherein: a) the passivation layer, or at least an innermost layer of the laminate of multiple passivation layers which is disposed adjacent each of the one or more underlying electrical elements, is discontinuous; and/or b) the laminate of multiple passivation layers is recessed at a side which faces away from each of the underlying electrical elements, wherein a recess is provided in a region overlying each of the one or more electrical elements, such that the laminate of passivation layers is thinner in a thickness direction across the recess compared to other non-recessed regions of the laminate of passivation layers.

In a second aspect, the present invention provides an electrical component according to the first aspect, wherein the insulated electrical component is an actuator component for use in a droplet ejection apparatus.

In a third aspect, the present invention provides a microelectromechanical system device comprising an insulated electrical component according to the first aspect and a capping layer attached to the insulated electrical component and arranged so as to encapsulate each of the one or more electrical elements of the insulated electrical component.

In a fourth aspect, the present invention provides a droplet ejection head comprising an electrical component according to the first or second aspects or a device according to the third aspect.

In a fifth aspect, the present invention provides a droplet ejection apparatus comprising a droplet ejection head according to the fourth aspect.

Figure 1A:
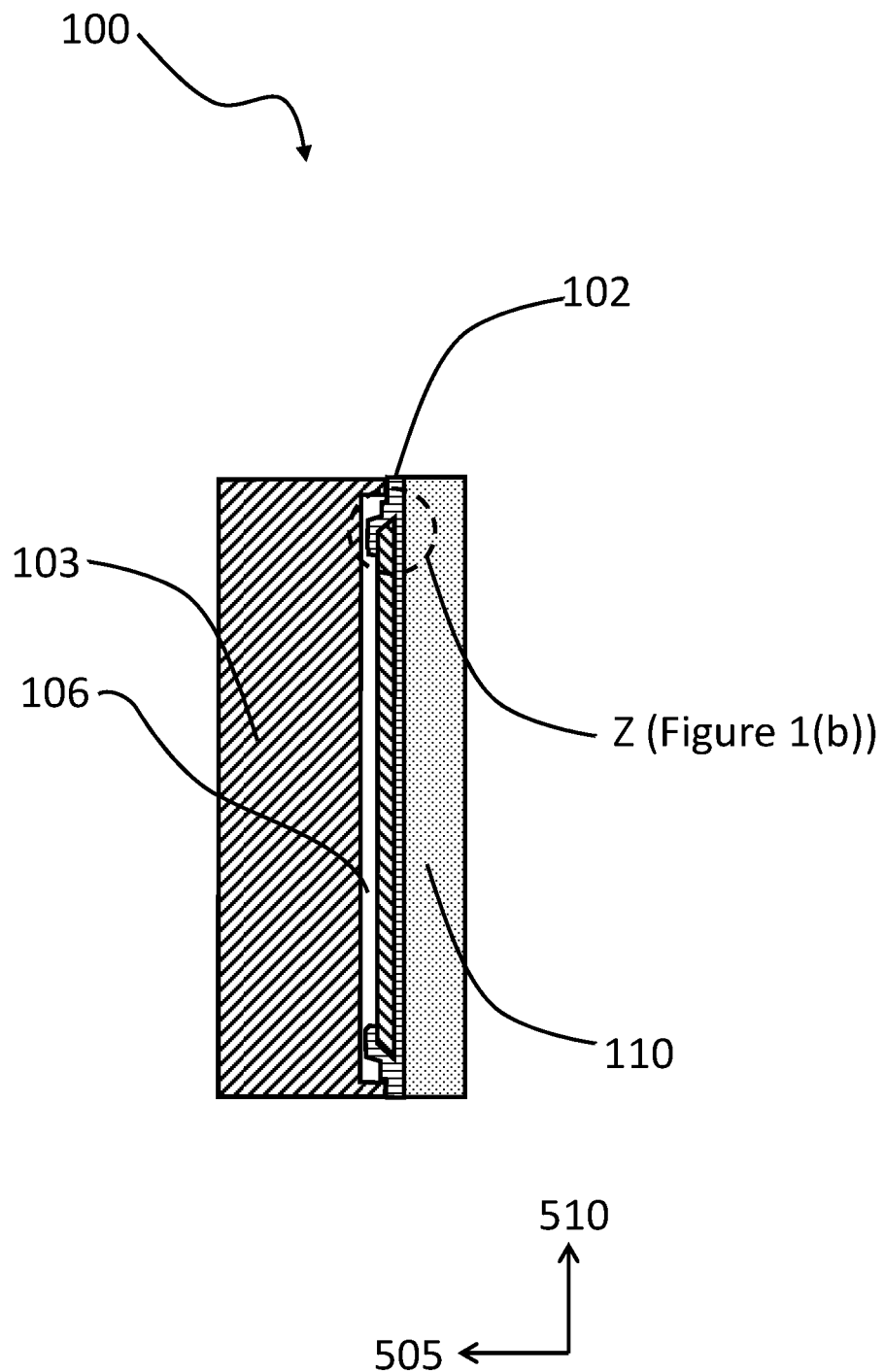
FIG. 1(a) is a schematic diagram of a cross-section through an electrical component according to an embodiment of the disclosure showing a general layout for an electrical element.

It should be noted that the drawings are not to scale and that certain features may be shown with exaggerated sizes so that these are more clearly visible.

DETAILED DESCRIPTION OF THE INVENTION

The insulated electrical component for a MEMS device of the first aspect comprises a substrate layer comprising first and second sides spaced apart in a thickness direction, wherein one or more electrical elements are arranged over the first side of the substrate layer.

The material of the substrate layer is not particularly limited. The substrate layer may be a silicon wafer or in other examples the substrate may be made of stainless steel, magnesium oxide (MgO), glass, nickel or the like. The substrate layer may be a laminate of two or more layers, where different layers may have the same or different composition. In some embodiments, the substrate comprises an uppermost layer which is in contact with the electrical element and which comprises silicon oxide, silicon nitride or the like. One or more lower layers of the laminate may be different from the uppermost layer and, for example, may comprise silicon wafer, MgO, stainless steel, glass or the like.

One or more optional additional intermediate layers may be interposed between the one or more electrical elements and the substrate layer, including but not limited to, a membrane layer or stack of membrane layers (e.g. vibrating plates) that deform under the action of the electrical element; stress gradient mitigating layers; barrier layers for preventing diffusion of ions between the ceramic member and the substrate; and/or adhesion layers to improve adhesion of the electrical elements to the substrate. Such additional layers may comprise for example inorganic oxide or nitride layers, such as alumina, silica, silicon nitride, zirconia, tantala, hafnia and the like.

A membrane layer, or stack of membrane layers, may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), titanium oxide ($TiO_2$), silicon (Si), hafnia ($HfO_2$) or silicon carbide (SiC).

Stress gradient mitigating layers typically comprise silicon nitride, TEOS derived silica or other material layers whose Young's modulus is intermediate with respect to the Young modulus of the substrate and that of the electrical element, determined based on the Young modulus of its individual layers.

The optional additional intermediate layers may, in some instances, be considered to form part of the substrate itself (i.e. a multi-layer substrate) or additional layers may be added to the substrate to form a modified multi-layer substrate. Any substrate configuration suitable for use in MEMS applications may be used in connection with the present application.

In some embodiments, the electrical component comprises a plurality of adjacent electrical elements and at least one intermediate layer interposing the electrical elements and the substrate, wherein the at least one intermediate layer comprises hafnia, and a hafnia-containing intermediate layer is preferably disposed adjacent to the electrical elements of the electrical component.

Each electrical element which is arranged over the substrate comprises a thin film ceramic member and first and second electrodes disposed adjacent the ceramic member such that a potential difference may be established between the first and second electrodes and through the ceramic member during operation.

In some embodiments, the ceramic member and first and second electrodes are arranged in a stack of layers, each having lateral surfaces extending in a thickness direction, wherein the ceramic member has a first side and an opposing second side spaced apart in a thickness direction. The first side of the ceramic member faces the substrate layer and the first electrode is disposed adjacent the first side of the ceramic member so as to interpose the substrate layer and the ceramic member and the second electrode is disposed adjacent to the second side of the ceramic member.

The stack of layers, typically formed from sequential depositions, may be patterned, for instance, through etching. The patterning may be carried out in one or more steps. For example, the thin film ceramic member may be patterned first, followed by exposed regions of the underlying first electrode in separate patterning steps. Alternatively, the thin film ceramic member and first electrode may be patterned in a single step. Where the second electrode is patterned, the second electrode may be patterned first and then exposed regions of the underlying ceramic thin film member and the first electrode may be patterned together in one step or separately in successive steps.

The patterning steps can be carried out according to any process known in the art, for example by dry etching or wet etching. Preferably the patterning is carried out through dry etch using chlorine ($Cl_2$) and argon (Ar) in suitable ratio for a suitable period of time, such as in the range from 30 seconds to 5 minutes or 1 to 3 minutes, for example 2 minutes, over a suitable number of cycles, such as 1 to 10 cycles or 3 to 5 cycles, for example 4 cycles.

In alternative embodiments, the thin film ceramic member interposes the first and second electrodes in a direction perpendicular to a thickness direction of the electrical element. In those embodiments, the first and second electrodes may be deposited on lateral external surfaces of the thin film ceramic member, opposing each other in a direction substantially perpendicular to the thickness direction.

In other embodiments the first and second electrodes may be deposited adjacent to the thin film ceramic member and on the same surface of the thin film ceramic member, which surface may be opposite to the surface facing the substrate, in the thin film thickness direction. In such embodiments, first and second electrodes are formed as interdigitated electrodes each preferably comprising a plurality of electrode fingers. Alternatively, said interdigitated electrodes are deposited in slots formed in the thin film ceramic member in the thickness direction so that each digit is, at least in part, surrounded by the ceramic material.

In other embodiments, the first and second electrodes are deposited as interdigitated electrodes on the substrate before the deposition of the thin film ceramic member. When first and second electrodes are formed as interdigitated electrodes a potential difference may be established between the first and second electrode, through the thin film ceramic member regardless of the specific arrangement or specific location, provided that the first and second electrodes are disposed adjacent to the thin film ceramic member.

The first and second electrodes employed in the one or more electrical elements of the present invention are not particularly limited. Suitably, the first and/or second electrodes are layers of platinum (Pt), iridium (Ir), iridium oxide ($IrO_2$), ruthenium (Ru), lanthanum nikelate ($LaNiO_3$), strontium ruthenate ($SrRuO_3$), or combinations thereof. The first and second electrodes may be formed of the same or different materials. In some embodiments, both first and second electrodes comprise platinum. Platinum is particularly preferred as a result of its high conductivity and high chemical stability, as well as its resistance to oxidation in oxygen environments at high temperatures.

The electrodes may be formed using any suitable technique known in the art, such as sputtering, physical or chemical vapour deposition techniques, electroplating or any other suitable technique.

The ceramic material of the ceramic member of each of the one or more electrical elements of the invention is not particularly limited provided it exhibits ferroelectric behaviour, for instance piezoelectric or ferroelectric/crossover properties, that make it suitable for use in MEMS applications.

The ceramic material of the thin film ceramic member may comprise a ceramic material with a major proportion of a perovskite crystallographic phase (i.e. above 50 vol. %), preferably at least 90 vol. % perovskite crystallographic phase, more preferably at least 95 vol. % piezoelectric crystallographic phase. Most preferably, the ceramic material is substantially homogeneous (i.e. phase pure), having only a perovskite crystalline phase.

In some embodiments, the ceramic material of the electrical element of the invention comprises lead, titanium, zirconium, niobium and/or zinc ions. Examples of lead-based ceramic materials that may be used in accordance with the present invention include $Pb[Zr_xTi_{1-x}]O_3$ ($0 \leq x \leq 1$), $Pb[(Zn_{1/3}Nb_{2/3})_xTi_{1-x}]O_3$ $0<x<1$, and $Pb[(Mg_{1/3}Nb_{2/3})_xTi_{1-x}]O_3$ ($0<x<1$).

In other embodiments, the ceramic material may be lead-free and/or contain bismuth, sodium and/or potassium ions, and may preferably be selected from $(Bi_{0.5}Na_{0.5})TiO_3$, $(Bi_{0.5}K_{0.5})TiO_3$, $Bi(Mg_{0.5}Ti_{0.5})O_3$, $(K_{0.5}Na_{0.5})NbO_3$, $BiFeO_3$ and solid solutions comprising combinations thereof.

The ceramic member of each of the one or more electrical elements of the present invention may comprise one or more thin film layers. Preparation of the ceramic thin films layers for MEMS applications typically involves chemical solution deposition using chemical solution precursors, or sputtering (e.g. RF magnetron sputtering) using solid state sintered or hot-pressed ceramic targets. Any other suitable method of preparation known in the art may also be used. The ceramic material thin film is preferably formed through chemical solution deposition.

For example, a multi-layer thin film ceramic member may be formed by means of multiple rounds of deposition and drying of precursor solution for the ceramic material, with crystallisation between each set of deposition and drying steps, or with only a single crystallisation step at the end of multiple rounds of deposition and drying. As will be appreciated, the composition of each of the layers of a multi-layer thin film ceramic member may be substantially identical. Alternatively, the composition of individual layers of a multi-layer thin film ceramic member may be optimised depending on whether, for instance, one of those layers will be in contact with the substrate and/or an electrode of the electrical element. Thus, in such embodiments, the composition of individual layers of a multi-layer thin film ceramic material may be different.

It is well-known that Pb, Bi, Na, and K are all volatile species, particularly at process temperatures typical of perovskite crystallisation. To compensate for the high volatility of certain cations, precursor solutions may be prepared with amounts of excess cations added thereto. Providing cation excess can ensure that the desired stoichiometry is achieved and help reduce stoichiometric imbalance and point defects. Such excess of cationic species is common in CSD-prepared PZT thin films (for example, up to 20 mol %-40 mol % excess $Pb^{2+}$ can be added, depending on solution chemistry). In a similar manner, bismuth cation precursor solutions, as well as precursor solutions of other cations, particularly those comprising sodium and potassium, may be prepared with an appropriate level of cation excess as may be determined by the skilled person by routine experimentation.

As will be appreciated by the skilled person, where there is a plurality of electrical elements in the electrical component, the ceramic member may initially be deposited before being patterned and segmented, for instance by etching, into multiple separated ceramic members, each associated with an individual one of the plurality of electrical elements.

Each of the one or more electrical elements is provided with a passivation layer, or laminate of multiple passivation layers. The passivation layer, or laminate of multiple passivation layers, is disposed adjacent to the one or more electrical elements so as to provide electrical passivation between the first and second electrodes of each of the one or more electrical elements and protection of the piezoelectric member.

The term "laminate of multiple passivation layers" is intended to refer to a plurality of overlaid passivation layers which are stacked in a thickness direction, wherein adjacent passivation layers are differentiated from each other either based on having different compositions, for example to the extent that each layer comprises a different major component (e.g. where major means above 50 vol. %), and/or by the presence of at least partially interposing intermediate layers which physically separate passivation layers, which passivation layers may or may not be of substantially the same composition. For example, as described herein, electrical traces may be incorporated between passivation layers of substantially the same composition. The presence of the interposing electrical traces in this case at least partially separates the layers such that they are distinguished over the cross-section, even if they have substantially the same composition.

As will be appreciated, the thickness of individual passivation layers, including at least partially interposing intermediate layers, may vary in the direction substantially perpendicular to the thickness direction across the electrical component. It will also be appreciated that individual layers of the laminate of passivation layers may themselves be formed from several overlaid sub-layers resulting, for instance, from multiple rounds of a deposition process. Such sub-layers are not, however, distinguished on the basis of composition, to the extent that each layer comprises a different major component, as described for the laminate discussed above, and are not separated by any interposing layers, so as to be considered distinct layers in a laminate. In some implementations the composition of the sub-layers may gradually vary in the thickness direction without the individual sublayers being clearly distinguished from each other. Similarly, where only a single passivation layer is provided instead of a laminate of multiple passivation layers, the single passivation layer may also comprise several sub-layers resulting, for instance, from multiple rounds of a deposition process.

In accordance with the present invention, a) the passivation layer, or at least an innermost layer of the laminate of multiple passivation layers which is disposed adjacent each of the one or more underlying electrical elements, is discontinuous; and/or b) the laminate of multiple passivation layers is recessed at a side which faces away from each of the underlying electrical elements, wherein a recess is provided in a region overlying each of the one or more electrical elements, such that the laminate of passivation layers is thinner in a thickness direction across the recess compared to other non-recessed regions of the laminate of passivation layers.

The term "discontinuous" used herein in connection with the passivation layer, or laminate of multiple passivation layers, is intended to refer to a passivation layer, or at least an innermost layer, or all layers, of a laminate of passivation layers (the innermost layer being disposed adjacent the one or more electrical elements), which does not extend continuously to fully overlie the one or more electrical elements and/or other regions overlying the substrate. It will be understood that "discontinuity" or "discontinuous region(s)" used in connection with the passivation layer or laminate of passivation layers are synonymous.

The discontinuity or discontinuous region in the passivation layer, or laminate of passivation layers, may, for example, be in the form of holes/apertures in the layer(s). In some arrangements, holes/apertures in the passivation layer, or at least the innermost layer, or all layers, of a laminate, mean that the passivation layer, or at least the innermost layer of the laminate, does not overlie a portion of the one or more electrical elements and/or does not overlie a portion of the intermediate regions between neighbouring electrical elements, where the component comprises a plurality of electrical elements. The discontinuity in the passivation layer, or at least the innermost layer, or all layers, of a laminate, means that the passivation layer, or at least the innermost layer, or all layers, of a laminate, overlie a minor proportion (i.e. less than 50%) or the one or more electrical elements and/or overlie a minor proportion (i.e. less than 50%) or the intermediate regions between neighbouring electrical elements.

The term "intermediate region" referred to herein refers to a region of the electrical component lying between (i.e. interposing) neighbouring electrical elements arranged over the substrate. Depending on the arrangement of electrical elements over the substrate (e.g. in rows or offset-rows or matrix), the intermediate regions will collectively track a course around the electrical elements arranged over the substrate, to the extent that the course interposes at least two neighbouring electrical elements. It will be appreciated that in the case of electrical elements located at the extremities of an arrangement of electrical elements of an electrical component (e.g. at one end of a row of elements), the intermediate regions will collectively track a course around the electrical elements but will not fully encircle those electrical elements at the extremities, since the intermediate regions only exist where at least two neighbouring electrical elements are interposed.

An intermediate region may thus extend, in a direction perpendicular to the thickness direction of the electrical component, from a lateral edge of one end of an electrical element to an oppositely facing lateral edge of one end of a neighbouring electrical element, where the lateral edge may be that of either the ceramic member or the first electrode (when the electrical element is arranged in a stack with the first electrode interposing the substrate and the ceramic member), whichever part of the electrical component extends furthest in a direction substantially perpendicular to the thickness direction over the substrate. The intermediate regions may thus be considered to be the valley regions between the peaks formed by the electrical components over the substrate.

When the passivation layer, or laminate or passivation layers, comprises a discontinuity which overlies an intermediate region, the discontinuity may be at any area of the intermediate region, provided that electrical passivation between the first and second electrodes is maintained. The discontinuity may extend only partially or fully over an intermediate region between neighbouring electrical elements, although preferably the discontinuity extends so as to interpose neighbouring electrical elements along substantially the entire length of oppositely facing lateral edges of neighbouring electrical elements.

In preferred arrangements, the passivation layer, or at least the innermost layer, preferably all layers, of the laminate, incorporate discontinuous regions such that it is segmented into isolated regions (i.e. non-connected islands), wherein each of the one or more electrical elements has an isolated region of the passivation layer, or laminate of passivation layers, at least partially overlying it.

In such an arrangement, where there is a plurality of electrical elements, intermediate regions between neighbouring electrical elements do not have the passivation layer, or at least the innermost layer of the laminate, extending completely thereover, thereby preventing one isolated region of the passivation layer, or at least the innermost layer of the laminate, being attached or in contact with another.

Providing discontinuity in the passivation layer, or at least the innermost passivation layer of a laminate of passivation layers, and particularly to the extent that complete segmentation is achieved forming isolated regions, has been found by the inventors to reduce or substantially prevent cascading failure mechanisms where chemical attack of a vulnerable passivation layer may occur and otherwise propagate throughout the passivation structure. The discontinuities break or disrupt such propagation pathways, avoiding cascading failure of multiple electrical elements. As will be appreciated, the discontinuity need not span the entire area of the intermediate region in order to be effective at reducing propagation of, for instance, dissolution over the passivation layer.

In addition, providing discontinuity in an intermediate layer interposing the electrical elements and the substrate, separately from or preferably in combination with a discontinuity in the overlying passivation layer or laminate of passivation layer can also help avoid the problem of cascading failure mechanisms and extend device lifetime. Thus, in preferred embodiments, the passivation layer(s) will have a discontinuity in an intermediate region which also coincides with a discontinuous region in any underlying intermediate layers, both of which may be the product of the same or multiple etching steps.

Alternatively or additionally, the discontinuity in the passivation layer, or laminate of passivation layers, is provided in a region overlying each of the one or more electrical elements. In preferred embodiments, the discontinuity/discontinuous region forms a window through to each of the one or more underlying electrical elements. The presence of a window means that at least part of the underlying electrical element is not overlaid by the passivation layer across the area of the window. This arrangement has been found by the inventors to be particularly advantageous in mitigating the negative impact of the passivation layer, or laminate of multiple passivation layers, on the displacement of the electrical element during operation, thereby preventing or reducing any inhibitive effect on the piezoelectric/electrostrictive performance of the ceramic member, whilst still ensuring adequate electrical passivation between the first and second electrodes of the electrical element.

In addition, or as an alternative to discontinuities as described hereinbefore, where a laminate of multiple passivation layers is provided, the laminate of passivation layers is recessed at a side which faces away from each of the underlying electrical elements, wherein a recess is provided in a region overlying each of the one or more electrical elements, such that the one or more outermost passivation layers of the laminate of multiple passivation layers, is removed in a thickness direction across the recess. One or more innermost passivation layers are left overlying the one or more electrical elements across the recess. Recessing in this manner has also been found to have a beneficial effect in reducing the inhibitory effects of the passivation layers on the displacement of the electrical element during operation.

The term "recess" used herein in connection with a laminate of multiple passivation layers is intended to refer to a well or cavity in the laminate, penetrating through at least one layer, but not all layers, of a laminate of passivation layers, at the surface of the laminate which faces away from the underlying electrical elements. It will be understood that one or more of the innermost passivation layers of the laminate of passivation layers is/are left overlying each of the electrical elements across the recess. The recess may extend (in a plane perpendicular to the thickness direction) across a portion, preferably all, of the ceramic member of each of the one or more electrical elements, so long as appropriate passivation of the electrodes of the one or more electrical elements, and any traces connected thereto, is ensured.

Any suitable size of recess may be used which reduces an inhibitory effect of the passivation layer on the displacement of the one or more electrical elements. As will be appreciated, a discontinuity in the form of a window in the passivation layer or laminate of passivation layers overlying the electrical elements as described hereinbefore achieves a similar effect to recessing of the laminate of passivation layers from the opposite direction. Consequently, both are not required.

As will be appreciated, the passivation layer, or the laminate of passivation layers, in any of the described arrangements may be formed by deposition of one or more passivation layers over the plurality of electrical elements with an intermediate or end step to pattern at least the innermost, or all, deposited passivation layers, for instance by etching or lithography, to provide the discontinuity/discontinuous region. Patterning as described above may, alternatively, be achieved through the use of deposition of the passivation layer, or at least the innermost passivation layer of a laminate, over a mask or the like.

A passivation layer, or laminate of passivation layers, may be deposited on the one or more electrical elements initially as a continuous layer(s) by any suitable deposition method, for example atomic layer deposition (ALD), molecular layer deposition (MLD), chemical vapour deposition (CVD), plasma enhanced chemical vapour deposition (PE-CVD), physical vapour deposition (PVD), sputtering and the like. Suitable materials for the passivation layer include, but are not limited to, metal oxides, metal nitrides and metal carbides as well as allotropes of carbon, such as diamond-like-carbon (DLC). In some embodiments, the passivation layer or laminate of passivation layers may comprise silica ($SiO_2$), silicon nitride ($Si_3N_4$) alumina ($Al_2O_3$), zirconia ($ZrO_2$), magnesia (MgO), tantala ($Ta_2O_5$), hafnia ($HfO_2$) silicon-tantalum oxide ($SiTaO_x$) or the like and combinations thereof. Preferably, the material and method chosen for the deposition should not create a reducing environment that can cause an increase in oxygen vacancies in the ceramic member, otherwise a high temperature recovery step in oxidising atmosphere may be required. Alumina is a particularly preferred material for use as the passivation layer, or the innermost layer of the laminate of passivation layers, since it has a very good adhesion to etched ceramic materials, particularly etched PZT. Silica, tantala, silicon-tantalum oxide ($SiTaO_x$) and hafnia are particularly suitable materials because of their high chemical inertness. Silica has also been shown to have good adhesion to etched ceramic materials, particularly etched PZT.

Where a laminate of passivation layers is employed, each layer may be composed of any one or more passivation materials as detailed above, and each layer may be deposited by the same or different techniques from one another. Thus, in some embodiments, the composition of at least one layer of a laminate of passivation layers is different from at least one other layer of the laminate. Preferably, the composition of the innermost layer of the laminate which is disposed adjacent to the one or more electrical elements differs from the composition of at least one other layer of the laminate, preferably all other layers of the laminate.

Preferably, in embodiments wherein the electrical component comprises a laminate of multiple passivation layers disposed adjacent to the ceramic member and first and second electrodes of each of the one or more electrical elements, the innermost layer of the laminate which is disposed adjacent the ceramic member and first and second electrodes comprises alumina, zirconia, hafnia, silica, tantala, and/or silicon-tantalum oxide and at least one of the other layers of the laminate which is not the innermost layer comprises silica and/or silicon nitride.

In particularly preferred embodiments, especially where the laminate of passivation layers includes a discontinuity, the innermost layer of the laminate comprises alumina and at least one, preferably all, remaining layers of the laminate comprise silica. In other particularly preferred embodiments, especially where the passivation layer includes recessing, with or without any discontinuity, the innermost layer of the laminate comprises hafnia, silica, tantala or silicon-tantalum oxide, and at least one, preferably all, remaining layers of the laminate comprise silica.

In other preferred embodiments, the laminate of passivation layers includes a plurality of silica layers and a plurality of tantala layers, wherein the innermost layer of the laminate comprises silica, and preferably wherein the silica and tantala layers are arranged in a generally alternate manner over the thickness of the laminate. In other preferred embodiments, the laminate of passivation layers includes one or more silica layers, one or more tantala layers, and one or more silicon-tantalum oxide layers, wherein the innermost layer of the laminate comprises silica and preferably wherein the one or more silicon-tantalum oxide layers separate/interpose the a silica layer and a tantala layer and preferably wherein the outermost layer of the laminate also comprises tantala. For example, the laminate of passivation layers may include an innermost silica layer and an outermost tantala layer separated by an interposing layer of silicon-tantalum oxide.

The total thickness of the passivation layer, or laminate of passivation layers, is not particularly limited, so long as adequate electrical passivation between the first and second electrodes is achieved. Nevertheless, a particular advantage of the present invention is that the discontinuous and/or recessed nature of the passivation layer(s) can be arranged such that the thickness of the passivation layer does not inhibit the piezoelectric/electrostrictive properties of the ceramic member of the electrical element, as discussed below. Thus, the present invention allows for the selection of passivation layering with total thickness which may be optimal for passivation (increasing thickness can for instance reduce defects), yet which might normally be considered inhibitive of piezoelectric/electrostrictive performance of the ceramic member (i.e. by inhibiting displacement of the electrical element).

Suitably, the total thickness of the passivation layer, or laminate of passivation layers, is lower than 750 nm, the thickness depending on the specific material, or combination of materials, and on the deposition method or methods employed. The minimum thickness is not particularly limited as long as continuous layers may be achieved initially, before patterning to create discontinuity or a recess, and adequate passivation of the first and second electrodes is achievable together with adequate protection of the piezoelectric member. Total thickness of the passivation (either as a single passivation layer or laminate of passivation layers) may thus be from 20 nm to 700 nm, preferably from 50 nm to 650 nm, more preferably from 100 to 600 nm. Where a laminate of passivation layers is used, the thickness of each passivation layer may suitably be from 5 to 500 nm, for example from 50 to 500 nm, from 100 to 450, or from 200 to 400 nm. As will be appreciated, when more than one passivation layer is present, each layer may be of a different thickness to another.

The passivation layer, or the innermost layer of the laminate of passivation layers, is deposited adjacent to the one or more electrical elements. The passivation layer, or the laminate of multiple passivation layers, electrically insulates the first and second electrodes from each other so that possible paths for shorts are no longer available. The skilled person is able to select an appropriate thickness and composition of the passivation layer, or laminate of multiple passivation layers, to achieve adequate electrical passivation according to the particular design of the electrical elements.

The passivation layer, or laminate of passivation layers, may isolate the electrical traces that provide connection to the drive circuitry to one of the first and second electrodes from the other of the first and second electrodes. Additionally the passivation layer or laminate of passivation layers may protect the electrical traces from the external environment.

In embodiments where the ceramic member and first and second electrodes are arranged in a stack of layers in a thickness direction as described hereinbefore, and each layer has lateral surfaces extending in a thickness direction, the passivation layer, or laminate of multiple passivation layers, at least partially overlies the second electrode (which is disposed on the opposite side of the ceramic member to that which faces the substrate) and is disposed adjacent to the lateral surfaces of the ceramic member and those of the first and second electrodes. Preferably the passivation layer, or laminate of multiple passivation layers overlies the second electrode to the extent that any traces connected to the second electrodes are reliably passivated.

As discussed hereinbefore, a particular advantage of the passivation in the present invention is that, where there is a plurality of electrical elements, having isolated regions of passivation layer(s) each associated with a single electrical element, it avoids cascading failure mechanisms which can lead to complete device failure as a result of failure of only a single electrical element. This is because a discontinuous passivation layer, or at least the innermost layer of a laminate of passivation layers, may be susceptible to chemical attack, or can be the most susceptible component to chemical attack, for example from the external environment. By having discontinuity in the intermediate regions between neighbouring electrical elements, propagation of chemical attack affecting multiple electrical elements can be reduced or prevented, avoiding complete device failure. The existence of isolated failed electrical elements can be compensated for (e.g. by adjusting waveform to adjacent functional electrical elements) to extend device lifetime.

The effect of a discontinuity is particularly useful where at least the innermost passivation layer has a composition that is particularly susceptible to chemical attack. For example, at least an innermost alumina passivation layer is particularly useful as a passivation layer for its ability to protect ceramic materials, particular etch-damaged PZT, yet alumina is particularly susceptible to chemical attack in certain environments. Thus, the present invention can be particularly beneficial for deriving the benefits from the use of alumina as a passivation layer material, whilst avoiding the detrimental impact on device lifetime it can otherwise exacerbate.

The electrodes of at least one of the one or more electrical elements are connected to drive circuitry through electrical traces. The electrical traces may be deposited on the passivation layer, or on one of the passivation layers of the laminate of multiple passivation layers, and they are connected to the electrodes, for instance, through vias formed in the passivation layer or layers. The vias can be differentiated from a discontinuity or recess as described herein because the vias are filled with an electrically conductive element or elements, whilst the discontinuities and recesses are not.

The electrical traces may be deposited by sputtering or by any other suitable method known in the art. The electrical traces are preferably metal traces for example comprising gold (Au), aluminium (Al), copper (Cu), platinum (Pt) or the like and combinations thereof. Thin adhesion layers for the traces may also be deposited prior to or after the formation of the electrical traces.

In some embodiments, the traces are themselves overlaid by at least one passivation layer of the laminate of multiple passivation layers so that the traces are at least partially interposed between layers of a laminate of multiple passivation layers and to the extent that the region of the traces that is to be connected to the drive circuitry is exposed.

In preferred embodiments, the electrical traces at least partially interpose two adjacent passivation layers of the laminate of multiple passivation layers, wherein the two adjacent passivation layers do not include the innermost passivation layer. In other preferred embodiments, the innermost layer of the laminate of passivation layers comprises alumina, zirconia, silica, tantala and/or hafnia, most preferably alumina, and the two adjacent passivation layers between which the electrical traces are interposed each comprises silica and/or silicon nitride, most preferably silica.

The electrical component of the invention further comprises a continuous insulating layer, or laminate of insulating layers, arranged to overlie each of the one or more electrical elements arranged on the first side of the substrate layer. As will be appreciated, the insulating layer acts as a barrier to isolate the electrical elements from the external environment and helps protect the electrical elements from chemical attack (e.g. from moisture or ink depending on the particular application of the electrical component). A particular benefit of the present invention is thus the provision of improved protection of the electrical component from the external environment and, in particular, protection from chemical attack. The continuous insulating layer, or laminate of insulating layers, used in the present invention also allows the advantages of a discontinuous or recessed passivation layer, or laminate or passivation layers, to be enjoyed without loss of protection from the external environment. As discussed hereinbefore, there are advantages to having discontinuous and/or recessed regions in the passivation layer, including for instance by providing a window or recess in the passivation layer, or laminate of passivation layers, in a region overlying each of the one or more electrical elements. This is used as a means for preventing or reducing inhibition of the displacement of the one or more electrical elements, so as to maximise piezoelectric/electrostrictive performance. The presence of a continuous insulating layer overlying the electrical component simultaneously protects the electrical elements from the external environment but can also plug defects, such as micro-cracks or pinholes, in the underlying passivation layer, and may also overlie discontinuous or recessed regions of the passivation layer, or laminate of passivation layers, such as in the case where a discontinuity is provided in the passivation layer or laminate of passivation layers in a region above each of the one or more electrical elements, or where a discontinuity is provided in an intermediate region between neighbouring electrical elements.

The term "laminate of insulating layers" is intended to refer to a plurality of overlaid insulating layers which are stacked in a thickness direction, wherein adjacent insulating layers are differentiated from each other either based on having different compositions, for example to the extent that each layer comprises a different major component (e.g. where major means above 50 vol. %), and/or by the presence of at least partially interposing intermediate layers which physically separate insulating layers, which insulating layers may or may not be of substantially the same composition.

As will be appreciated, the thickness of individual insulating layers, including at least partially interposing intermediate layers, may vary in the direction substantially perpendicular to the thickness direction across the electrical component. It will also be appreciated that individual layers of the laminate of passivation layers may themselves be formed from several overlaid sub-layers resulting, for instance, from multiple rounds of a deposition process. Such sub-layers are not, however, distinguished on the basis of composition, as described for the laminate discussed above, and are not separated by any interposing layers, so as to be considered distinct layers in a laminate. Similarly, where only a single insulating layer is provided instead of laminate of multiple passivation layers, the single insulating layer may also comprise several sub-layers resulting, for instance, from multiple rounds of a deposition process, as described above.

The term "continuous" used herein in connection with the insulating layer, or laminate of insulating layers, is intended to refer to an insulating layer, or laminate of insulating layers, which extends continuously, without disruption, to fully overlie the one or more electrical elements, and corresponding passivation layers(s) associated therewith, that are arranged over the substrate. Where there is a plurality of electrical elements, it will be appreciated that the insulating layer also extends over underlying intermediate regions between electrical elements. Thus, the continuous layer typically overlies substantially all of the side of the substrate upon which the electrical elements are arranged.

The insulating layer, or laminate of layers, may be deposited on each of the one or more electrical elements by any method of deposition known in the art. Preferably the insulating layer or laminate of layers will be deposited by a different method to the method used to deposit the outermost passivation layer. This would reduce the possibility that point defects present in the passivation layer will be reproduced and extended through the insulating layer or laminate of layers. Preferably the insulating layer or laminate of insulating layers are deposited by atomic layer deposition (ALD), molecular layer deposition (MLD), sputtering and the like. Suitable materials for the insulation have a very high chemical inertness. Examples of suitable materials include but are not limited to silica ($SiO_2$), zirconia ($ZrO_2$), tantala ($Ta_2O_5$), hafnia ($HfO_2$) or the like and combinations thereof.

The insulating layer, or laminate of insulating layers, preferably includes one or more layers of silica, hafnia, zirconia, tantala, and combinations thereof. In some embodiments the insulating layer, or laminate of insulating layers, includes one or more layers of silica and/or tantala, zirconia and hafnia. In other embodiments the insulating layer is a laminate of insulating layers including a plurality of silica layers and one or more layers of tantala, zirconia or hafnia, or a plurality of tantala layers and/or one or more layers of zirconia or hafnia.

In preferred embodiments the laminate of insulating layers includes a plurality of silica layers, wherein a silica layer is arranged so as to be adjacent to the electrical element/passivation layer, and wherein the laminate further comprises a plurality of tantala layers, preferably wherein the silica and tantala layers are arranged in a generally alternate manner over the thickness of the laminate.

The thickness of the insulating layer, or laminate of insulating layers, is not particularly limited although thinner layers are generally preferred to reduce any possible inhibition of the displacement of the electrical element during operation. Generally the thickness of the insulating layer or laminate of insulating layers is suitably in the range of from 10 nm to 50 nm, preferably from 12 to 30 nm, more preferably from 15 to 25 nm. Different thickness values might be required according to the nature of the insulating material and the deposition technique.

The insulating layer or laminate of insulating layers is preferably made of a chemically robust material for example hafnia, tantala, zirconia and silica, alone or in combination, and is preferably deposited by atomic layer deposition (ALD). The combination of silica and tantala layers has been found by the inventors to be particularly effective in providing protection from the external environment, particularly from an aqueous environment, for example when the electrical component is being used in a droplet ejection head with aqueous inks or where aqueous contaminants are present.

The insulating layer or laminate of insulating layers may fully cover each electrical element of the electrical component, especially any discontinuity in the passivation layer or laminate of passivation layers. Moreover, the insulating layer provides means for mending (e.g. filling/plugging) defects in the underlying passivation layer or the outermost of the layers of the laminate of passivation layers, such as micro-cracks or pinholes. This has been found to be particularly effective where ALD is used as method of deposition of the insulating layer contacting the passivation layer or outermost layer of the laminate of passivation layers. The presence of the insulating layer may also confer a more uniform topography to the electrical component so that the bonding to a capping layer in MEMS applications may be more effective and less prone to defects such as voids or the like that are exacerbated by increased topography.

As discussed above, the insulating layer or laminate of insulating layers typically overlies substantially all of the surface of the electrical component which includes the one or more electrical elements. It will nevertheless be appreciated that the insulating layer or laminate of insulating layers may be removed from those areas on the electrical component where electrical connections with the driving circuitry have to be established. Such areas do not overlie any of the electrical elements provided on the electrical component.

The insulating layer or laminate of insulating layers may protect the electrical elements from the external environment and from contact with chemicals so that the manufacturing process of the electrical component including one or more electrical elements may reach higher yields and the lifetime of the electrical component may be extended. The combination of the continuous insulating layer and the discontinuous passivation layer is particularly advantageous in extending the usable lifetime of the electrical component.

In a second aspect, the present invention provides an actuator component for use in a droplet ejection apparatus, wherein the actuator component is the electrical component according to the first aspect.

In a third aspect, the present invention provides a microelectromechanical system including an insulated electrical component according to the first aspect and a capping layer attached to the insulated electrical component. The capping layer may define a single cavity for groups of, or all of, the electrical elements, or may define a respective cavity for each electrical element. Such cavities may be sealed in a fluid-tight manner. The capping layer may be formed of silicon (Si), and may for example be manufactured from a silicon wafer, whilst the features provided in the capping layer, including the cavities may be formed using any suitable fabrication process, e.g. an etching process, such as DRIE or chemical etching. In some cases, at least a subset of features of the capping layer may be formed from an additive process, such as a CVD technique (e.g. PECVD), or ALD. In still other cases, the features may be formed using a combination of etching and/or additive processes. The capping wafer may be bonded to the electrical component through the insulating layer or the laminate of insulating layers.

The presence of the insulating layer may help improving the topography of the electrical component so that the bonding to the capping layer may be more effective and less prone to defects such as voids or the like.

In some embodiments the microelectromechanical device may further include a nozzle plate attached to the insulated electrical component and arranged to be at the opposing side of the electrical component to the capping layer.

In a fourth aspect the present invention provides a droplet ejection head comprising the electrical component or a MEMS device as described above.

In a fifth aspect the present invention provides a droplet ejection apparatus comprising a droplet ejection head according to the fourth aspect.

Droplet deposition apparatuses have widespread usage in both traditional printing applications, such as inkjet printing, as well as in 3D printing and other materials deposition or rapid prototyping techniques.

An actuator component suitable for use in a droplet deposition apparatus may, for instance, comprise a plurality of fluid chambers, which may be arranged in one or more rows, each chamber being provided with a respective actuator element and a nozzle. As will be appreciated, in this aspect the actuating element corresponds to the electrical element described hereinbefore and is actuable to cause the ejection of fluid from a chamber of the plurality through a corresponding one of the nozzles. The actuating element may, for example, function by deforming a wall bounding one of the fluid chambers of the actuator component. Such deformation may in turn increase the pressure of the fluid within the chamber and thereby cause the ejection of droplets of fluid from the nozzle. Such a wall may be in the form of a membrane layer which may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), hafnia ($HfO_2$), tantala ($Ta_2O_5$), zirconia ($ZrO_2$), titanium oxide ($TiO_2$), silicon (Si) or silicon carbide (SiC).

The droplet deposition apparatus typically comprises a droplet ejection head comprising the actuator component and one or more manifold components that are attached to the actuator component. Such droplet ejection heads may, in addition, or instead, include drive circuitry that is electrically connected to the actuating elements, for example by means of electrical traces provided by the actuator component. Such drive circuitry may supply drive voltage signals to the actuating elements that cause the ejection of droplets from a selected group of fluid chambers, with the selected group changing with changes in input data received by the head.

To meet the material needs of diverse applications, a wide variety of alternative fluids may be deposited by droplet ejection heads as described herein. For instance, a droplet ejection head may eject droplets of ink that may travel to a sheet of paper or card, or to other receiving media, such as textile or foil or shaped articles (e.g. cans, bottles etc.), to form an image, as is the case in inkjet printing applications, where the droplet ejection head may be an inkjet printhead or, more particularly, a drop-on-demand inkjet printhead.

Alternatively, droplets of fluid may be used to build structures, for example electrically active fluids may be deposited onto receiving media such as a circuit board so as to enable prototyping of electrical devices. In another example, polymer containing fluids or molten polymer may be deposited in successive layers so as to produce a prototype model of an object or for manufacture of production components (as in 3D printing). In still other applications, droplet ejection heads might be adapted to deposit droplets of solution containing biological or chemical material onto a receiving medium such as a microarray.

Droplet ejection heads suitable for such alternative fluids may be generally similar in construction to printheads, with some adaptations made to handle the specific fluid in question. Droplet ejection heads which may be employed include drop-on-demand droplet ejection heads. In such heads, the pattern of droplets ejected varies in dependence upon the input data provided to the head.

Structure of the Electrical Element

The invention will now be described with reference to the drawings, which are intended to be illustrative of the invention and in no way limiting and which are not to scale, for the sake of clarity.

FIG. 1(a) is a schematic diagram of a cross-section through an electrical component included in a microelectromechanical systems device 100. FIG. 1(a) shows a general layout for an electrical element of the electrical component. FIG. 1(a) depicts a substrate layer 110 with an electrical component 102 located above in the thickness direction 505.

Figure 1B:
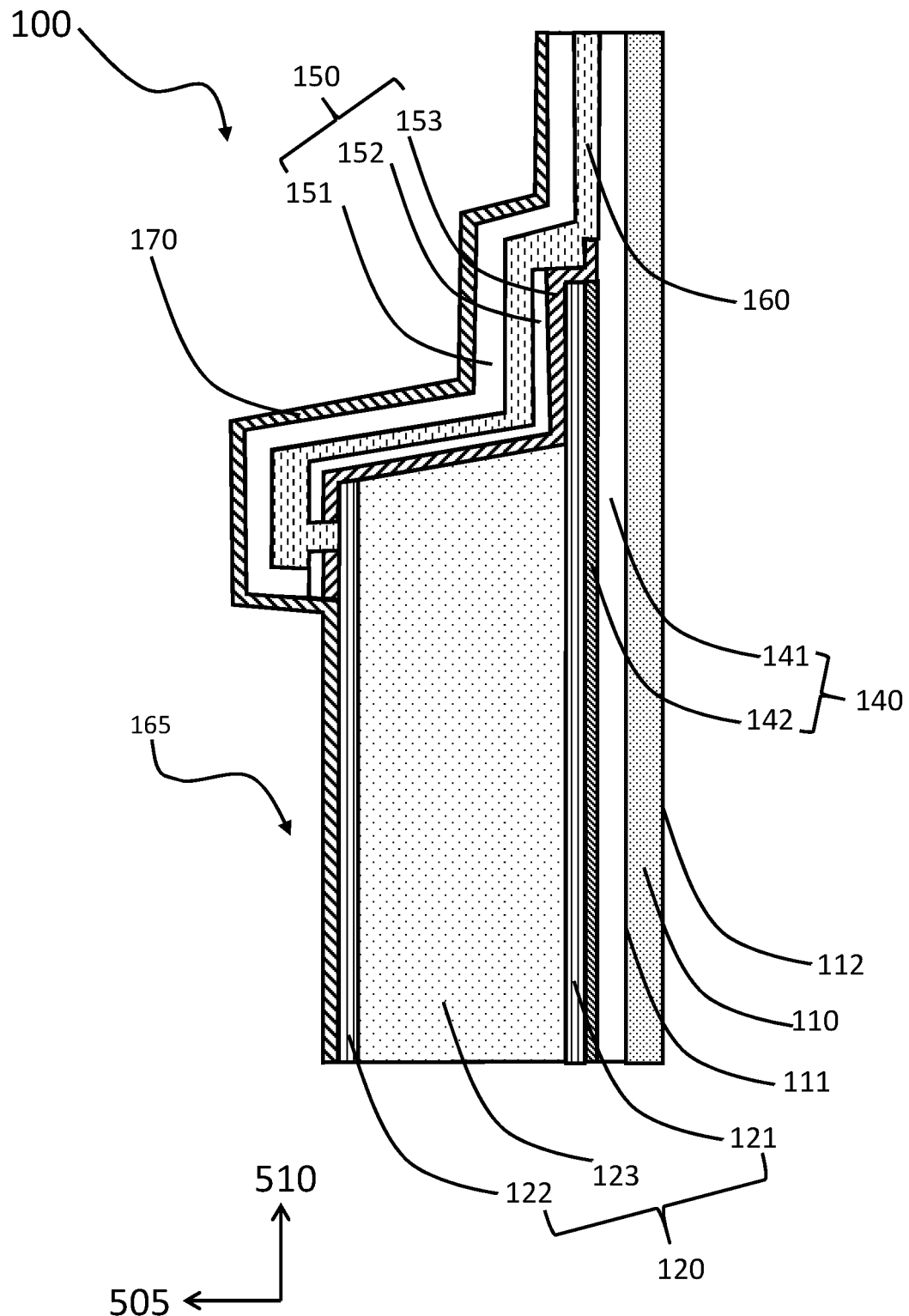
FIG. 1(b) is a schematic diagram of a portion Z of the cross-section in FIG. 1(a) according to an embodiment of the disclosure.

The electrical component 102 may comprise multiple layers (as shown in FIG. 1(b), discussed below). A capping layer 103 may be attached to the electrical component 102 at numerous disparate locations. As may be seen from FIG. 1(a), in microelectromechanical systems device 100, the electrical component 102 is elongate in cross-section such that its length in the length direction 510 is much greater than its thickness in the thickness direction 505. The direction out of the page is the width direction 500. In a microelectromechanical systems device 100 for a droplet ejection head the thickness direction 505 may be antiparallel to the ejection direction, where the ejection direction is the direction in which droplets of fluid exit the nozzles, and the width direction 500 may be parallel to the row direction, which is the direction in which a row of actuators and nozzles are arranged.

Considering now FIG. 1(b), FIG. 1(b) is a schematic diagram of a portion Z of the cross-section in FIG. 1(a) according to a first embodiment of the first aspect of the invention. FIG. 1(b) depicts a portion of an electrical element included in an insulated electrical component for a microelectromechanical systems device. A substrate layer 110 comprises first and second sides 111 and 112 respectively which are spaced apart in the thickness direction 505. The electrical element 120 is arranged over the first side 111 of the substrate layer 110. The electrical element 120 comprises a ceramic member 123 and first and second electrodes 121 and 122 respectively which are disposed adjacent to the ceramic member 123 such that a potential difference may be established between the first electrode 121 and the second electrode 122 and through the ceramic member 123 during operation. A continuous insulating layer 170, which may be a laminate of insulating layers, is arranged to fully overlie each of the one or more electrical elements 120 arranged on the first side 111 of the substrate layer 110. A discontinuous passivation layer 150, comprises layers 151 to 153 such that it is a laminate of multiple passivation layers, partially interposing the insulating layer 170, and the one or more electrical elements 120. The laminate of multiple passivation layers, is disposed adjacent to, and partially overlying, each of the one or more electrical elements 120 so as to provide electrical passivation between the first 121 and second 122 electrodes of each of the one or more electrical elements 120.

In order to provide electrical connection to the second electrode 122 an electrical trace 160 is provided on the passivation layer 153. A further electrical trace is provided to electrically connect the first electrode 121 (connection not visible in FIG. 1(b)). The microelectromechanical systems device further comprises an intermediate layer 140 which is disposed adjacent to the first side 111 of the substrate layer 110. The intermediate layer 140 is located between the substrate layer 110 and the electrical element 120. The intermediate layer 140 comprises a continuous layer 141 and a discontinuous layer 142.

Figure 2:
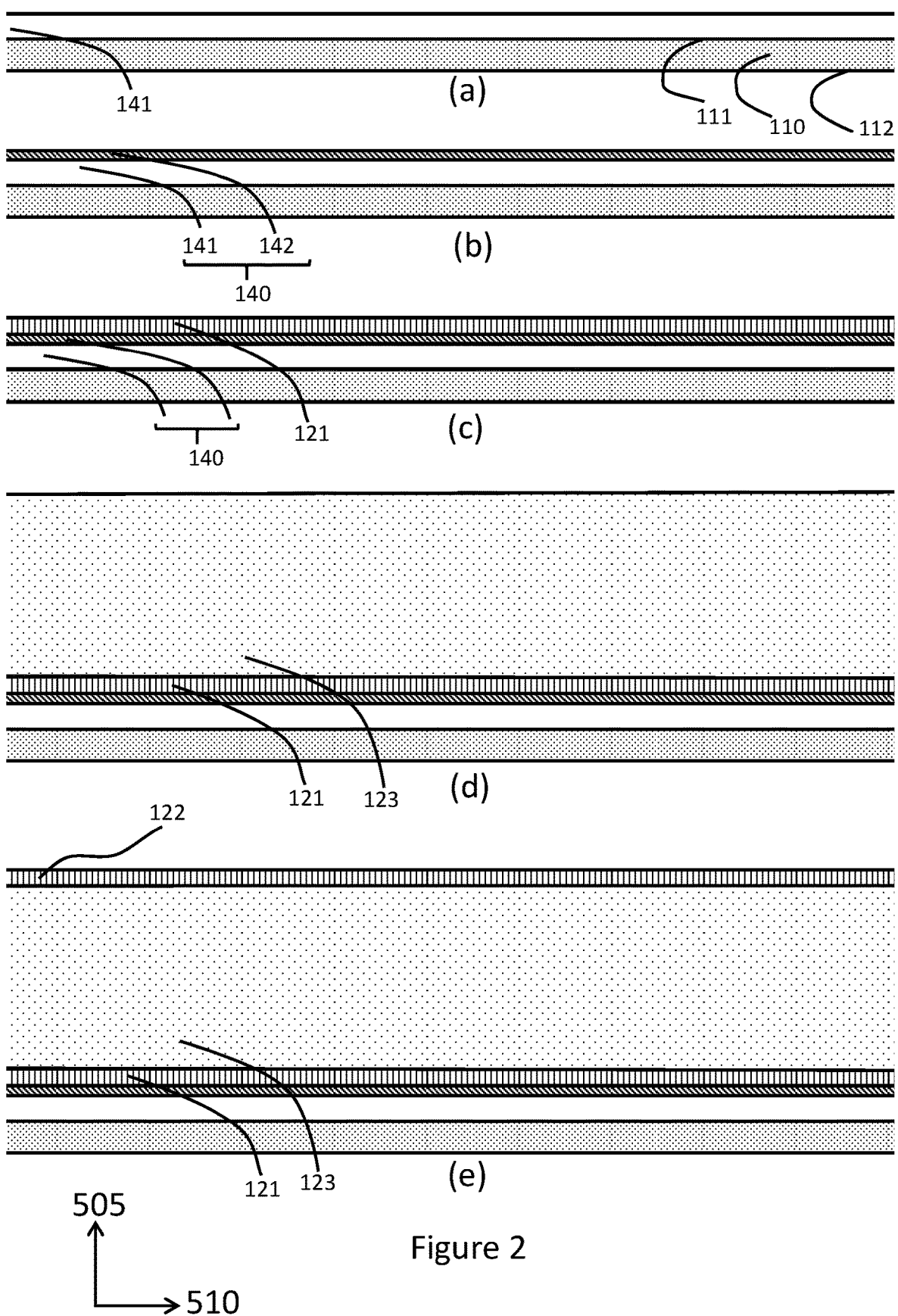
FIGS. 2(a) to 2(o) depict a series of schematic diagrams of the portion Z depicted in FIG. 1(b) at various stages during the manufacturing process of the electrical component.
Figure 2:
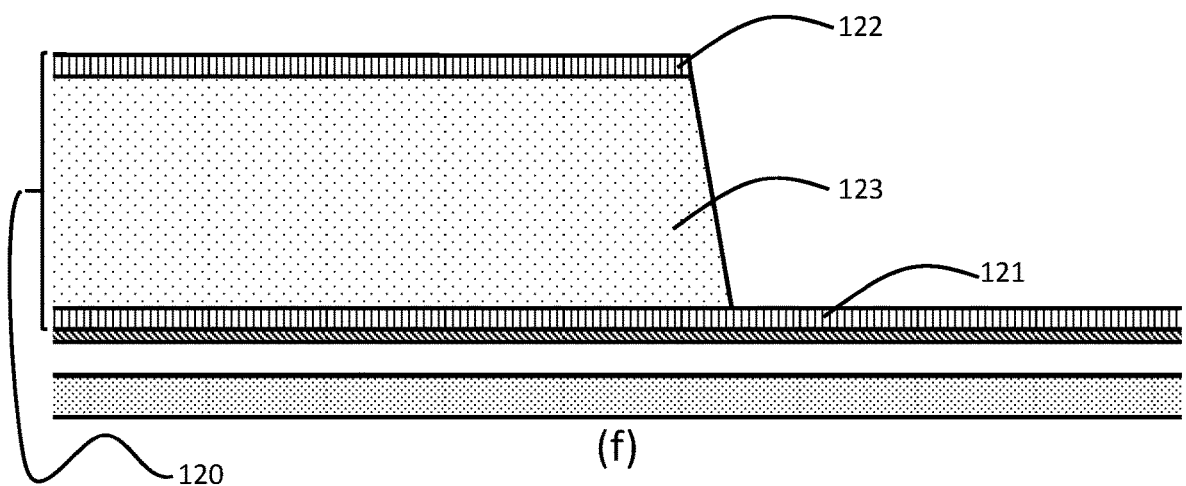
Figure 2:
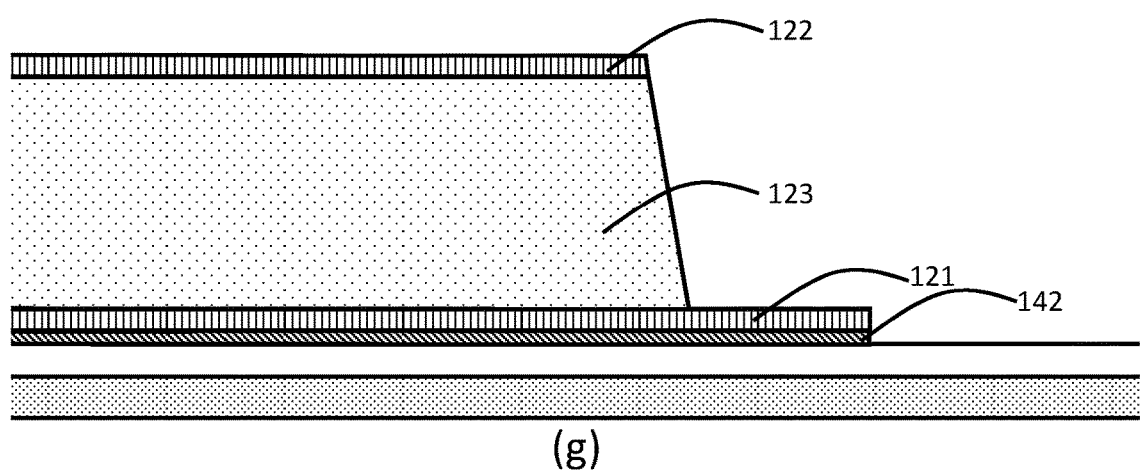
Figure 2:
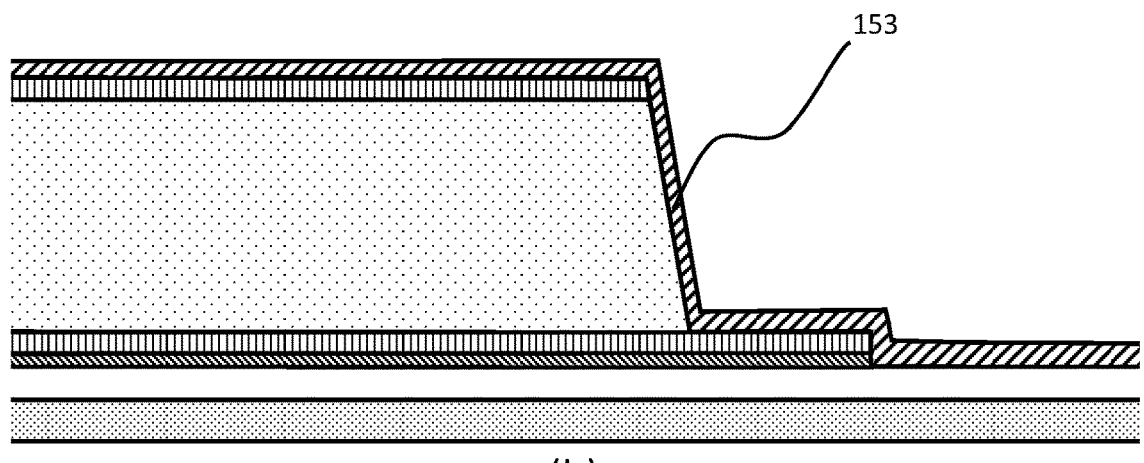
Figure 2:
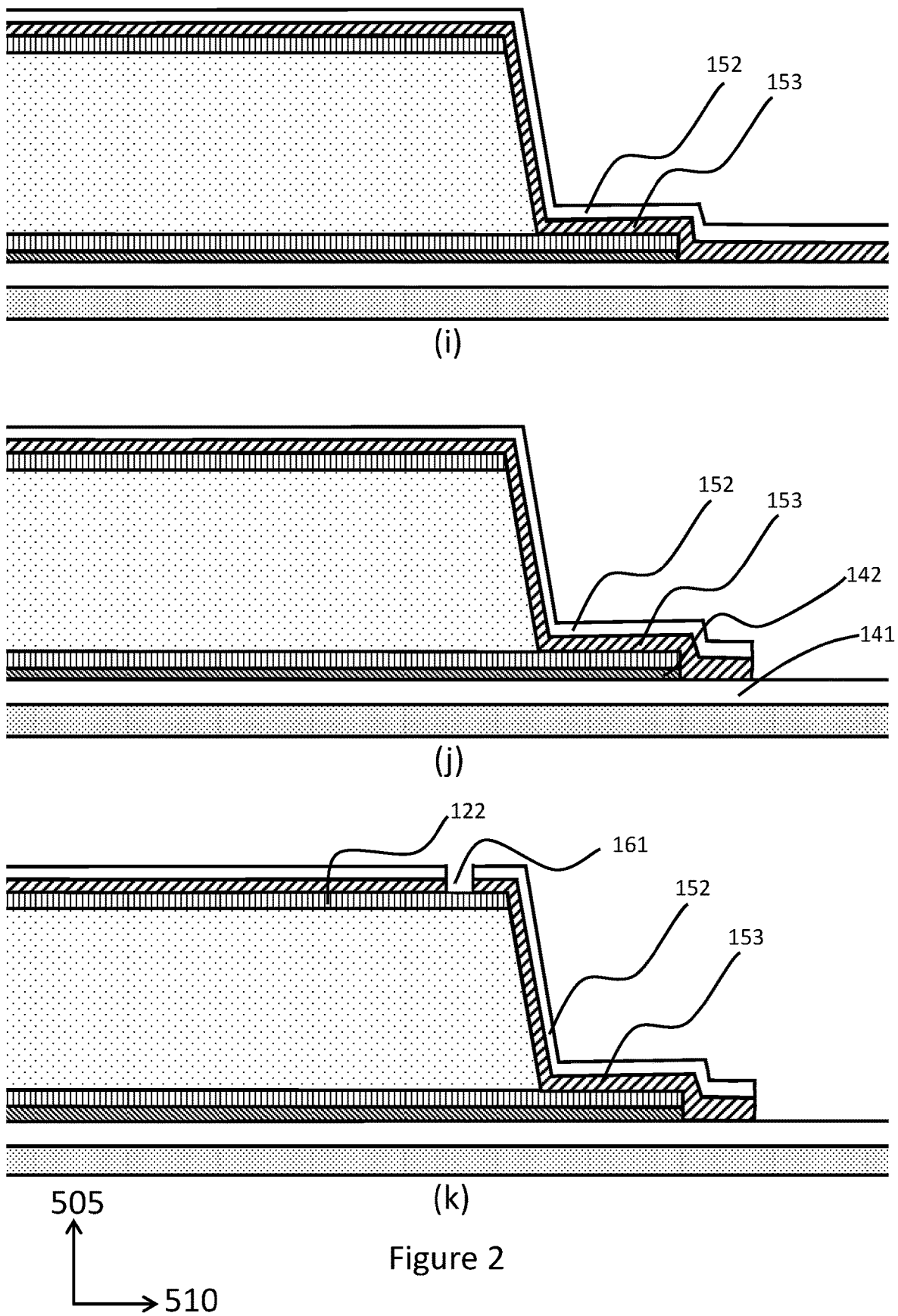
Figure 2:
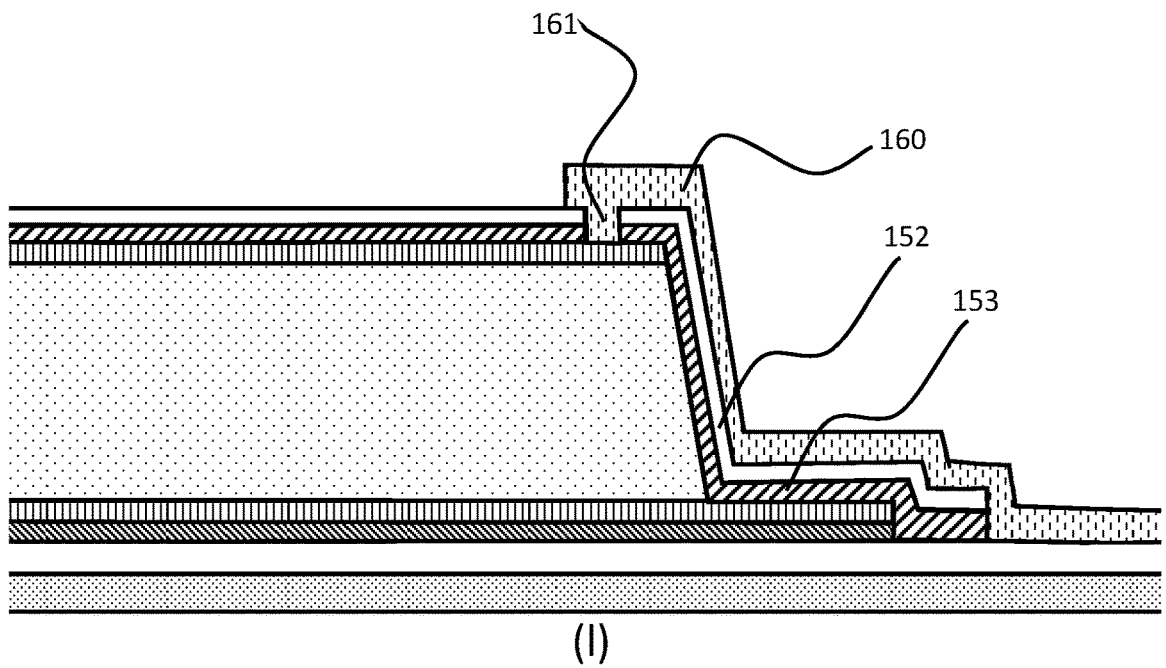
Figure 2:
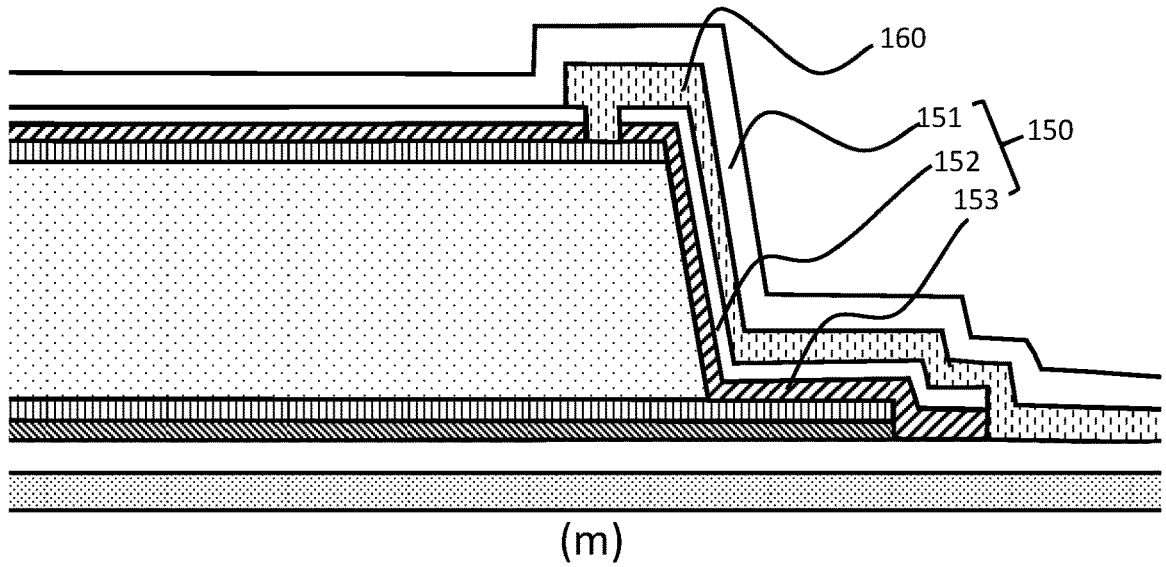
Figure 2:
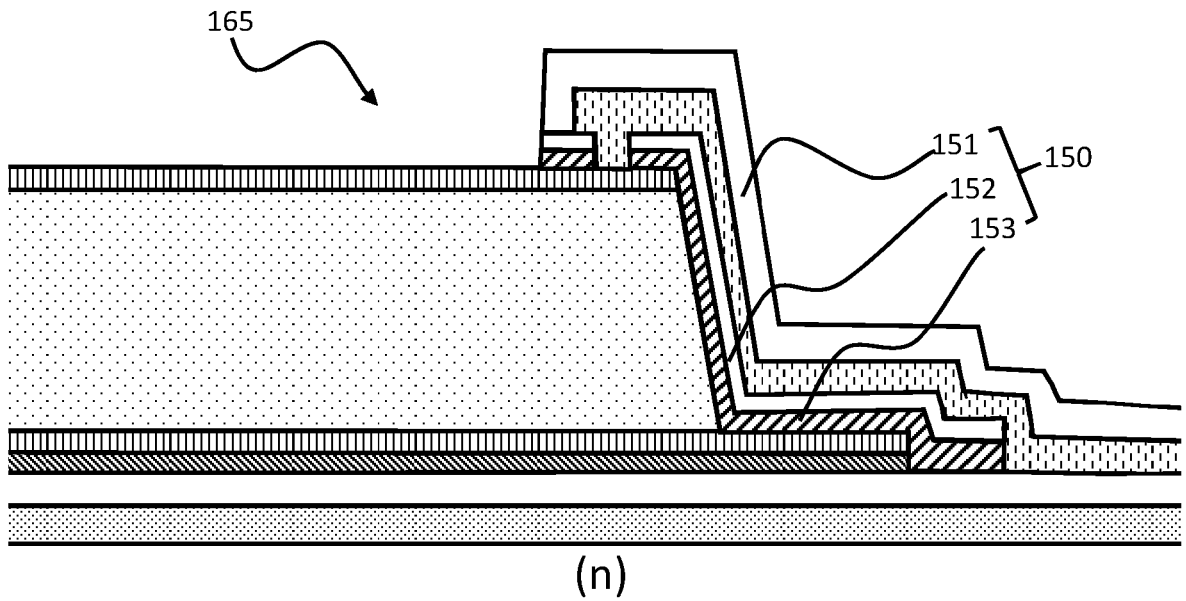
Figure 2:
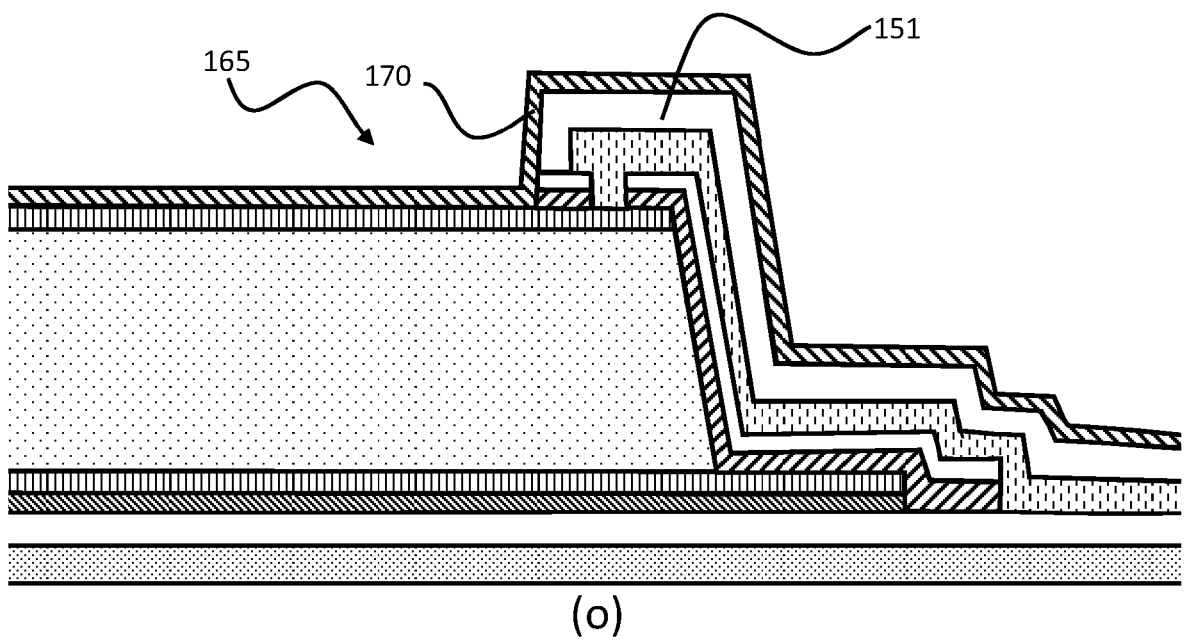
Figure 2:
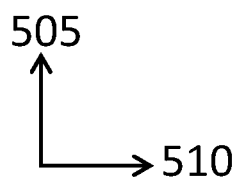

Turning now to FIGS. 2(a) to 2(o), this is a series of schematic diagrams showing the various stages of the manufacturing process of the portion Z of the electrical element as indicated in FIG. 1(a) and depicted in more detail in FIG. 1(b). The manufacturing process starts with a substrate layer 110 comprising a first side 111 and a second side 112 which are spaced apart in the thickness direction 505. The material of the substrate is not particularly limited. In this case the substrate is a silicon wafer.

FIG. 2(a) shows the initial deposition stage in which an intermediate layer 140 is formed on the first side 111 of the substrate layer 110. The intermediate layer is formed of sub-layers 141 and 142 deposited on top of each other in the thickness direction 505, as shown in FIG. 2(b). The layer 141 is, for example, $SiO_2$ formed by thermal oxidation of the silicon wafer. The layer 142 is, for example, made of $Al_2O_3$ deposited by atomic layer deposition.

Considering now FIG. 2(c), this shows the stack after the deposition of the first electrode 121, which is, for example, formed of platinum (Pt).

FIG. 2(d) shows the stack after the ceramic member 123 has been added on top of the first electrode 121. The thin film ceramic member is, for example, Nb doped PZT (PNZT) deposited by sol-gel deposition, according to the following example method: i) a 15 wt. % PNZT solution (P/N/Z/T—115/2/52/48) was spin coated onto the first electrode at 3500 rpm for 45 seconds with a dynamic dispense at 500 rpm; ii) after spin-coating, the single layers were dried at 100° C. for 1 minute and pyrolysed at 300° C. for 4 minutes; and iii) the pyrolysed layers were crystallised in a rapid thermal annealer (RTA) at 700° C. for 1 minute under 2 SLPM of $O_2$ flow, with a heating rate of 10° C./s. Steps i) to iii) were then repeated until the thin film reached a thickness of 2 μm.

Next, as shown in FIG. 2(e), the second electrode 122 is layered on top of the ceramic member 123. The second electrode may, for instance, be another Pt electrode deposited according the same procedure as the first electrode. Alternatively, the second electrode may be compositionally different to the first electrode, for instance, a combination of iridium and iridium oxide layers. Together, the first electrode 121, the ceramic member 123 and the second electrode 122 form the electrical element 120.

As may be seen in FIGS. 2(f) and 2(g), the next steps are patterning of the second electrode 122 and the ceramic member 123 and then of the first electrode 121. The patterning is carried out through dry etch using chlorine ($Cl_2$) and argon (Ar) for 4 cycles and a total duration of 2 minutes. The second electrode is patterned first, followed by the lower-lying PNZT and second electrode layers.

Next, as depicted in FIGS. 2(h) and 2(i), a first passivation layer 153 and then a second passivation layer 152 are deposited over all of the exposed surfaces of the stack in the thickness direction 505.

The passivation layer 152 may, for example, be an alumina layer deposited by atomic layer deposition to a thickness of 80 nm. The passivation layer 153 is, for example, made of silica and is deposited by plasma enhanced chemical vapour deposition (PE-CVD) to a thickness of 200 nm.

The layers 152 and 153 are successively patterned as shown in FIG. 2(j) for example by lithography.

In FIG. 2(k), a dielectric via etch is performed to create a via 161 and expose a portion of the second electrode 122 to enable an electrical connection to be formed. In this step another via 162 enabling electrical connection to the first electrode 121 is also etched (not shown in this cross-section).

In FIG. 2(l), metal deposition is performed so that the vias 161 and 162 (not shown) are filled in and electrical traces 160 are laid down to provide electrical connection to both the first electrode 121 and the second electrode 122. The electrical traces may, for instance, be formed by sputtering aluminium (Al), gold (Au), copper (Cu), nickel (Ni) and the like or combinations thereof.

Turning now to FIG. 2(m), a third passivation layer 151 is deposited over the entire exposed surface of the stack in the thickness direction 505. The passivation layer 151 is, for example, made of silica deposited by PE-CVD to a thickness of 500 nm. The passivation layer 151 is deposited also on the metal trace 160.

The passivation layers 151-153 are then etched over the electrical element 120. As seen in FIG. 2(n), this may provide the complete removal of the passivation layers 151-153 over a region overlying the electrical element 120 so as to form a 'window' through to the second electrode 122.

Figure 3A:
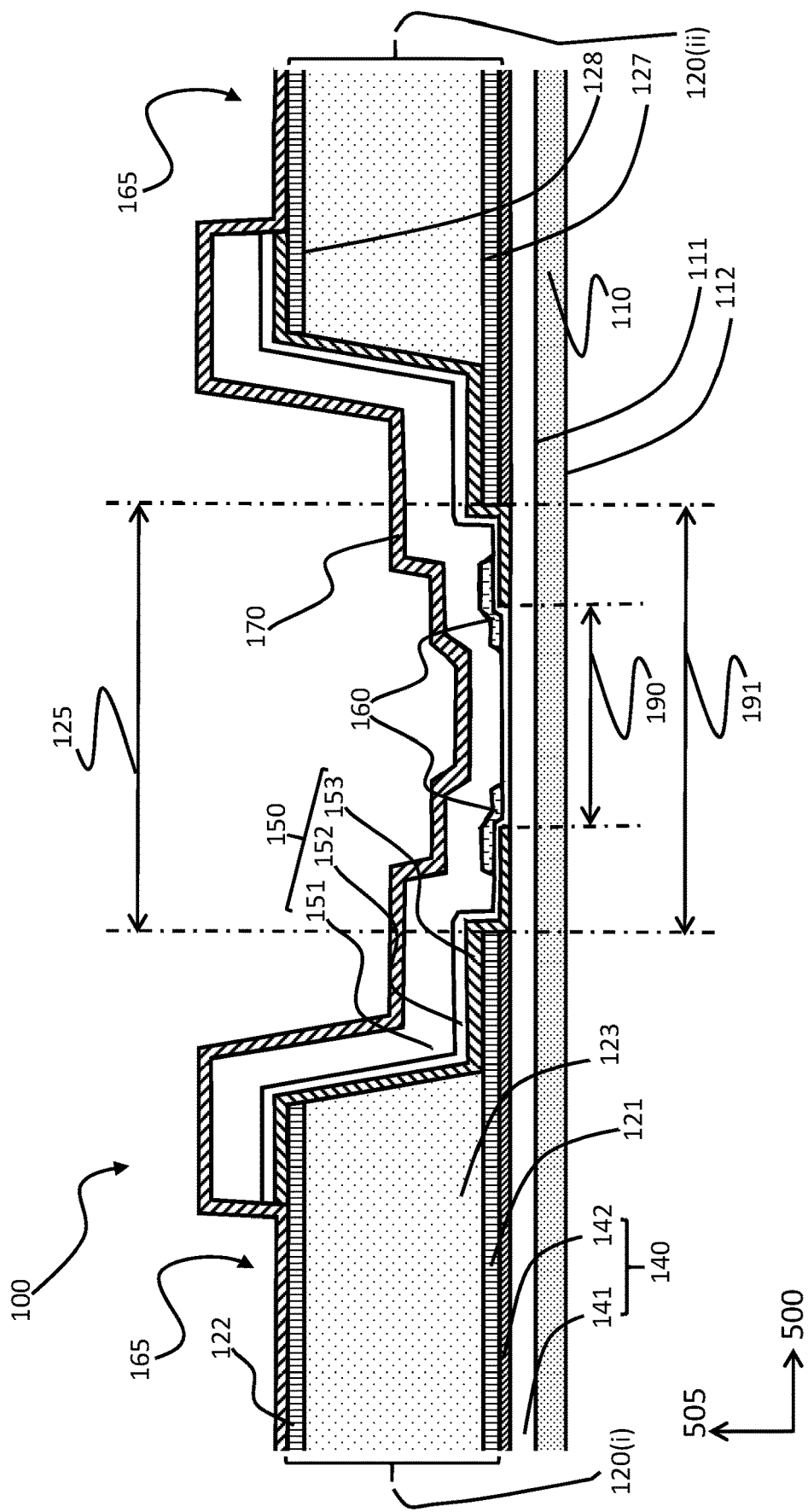
FIGS. 3(a) to 3(c) depict a series of schematic diagrams of a cross section in the width direction of portions of two neighbouring electrical elements according to embodiments of the disclosure.
Figure 3B:
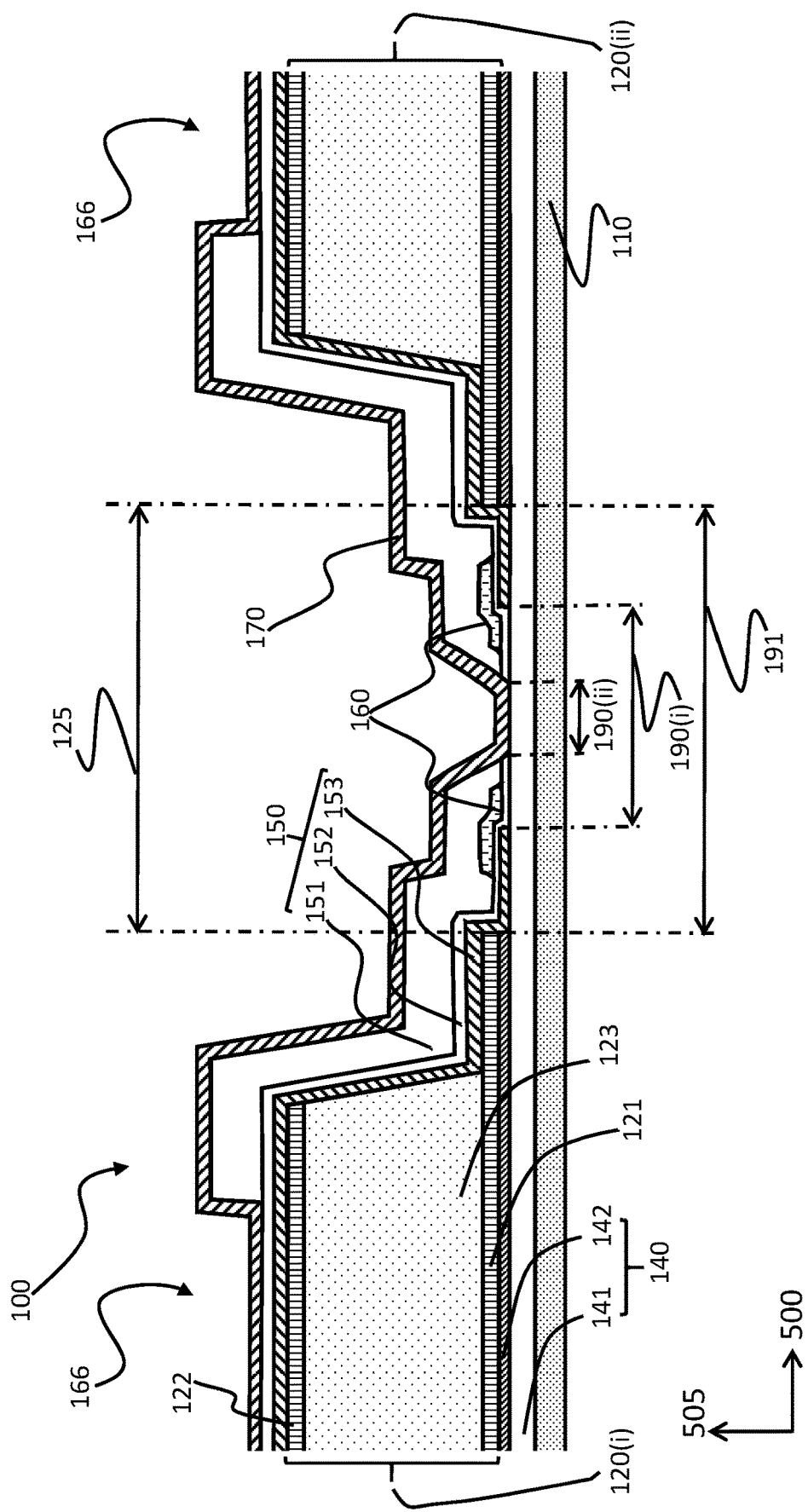

In alternative embodiments it may be understood that one or more of the outermost layers of a laminate of passivation layers may be removed so as to form a recess 166, as shown in FIG. 3(b). The laminate of passivation layers 150 is, therefore, thinner in a thickness direction 505 across the recesses 166 compared to other non-recessed regions of the laminate of passivation layers 150. In other words the laminate of passivation layers 150 may be recessed at a side which faces away from each of the underlying electrical elements 120 in the thickness direction 505, wherein a recess 166 is provided in each region overlying each of the plurality of electrical elements 120. Preferably the passivation 150 is initially formed by a laminate of continuous passivation layers and successively one or more outermost passivation layers are etched to form a recess 166. It will be understood that one or more of the innermost passivation layers are left overlying each of the one or more electrical elements across the recess 166 and that the first passivation layer exposed at the bottom of the recess acts as an etch stop for the removal of the outermost one or more passivation layers. The formation of such a recess 166 may require the use of suitable etches and etch stops such that one of the other layers of the laminate of passivation layers 150 acts as an etch stop (in the depicted instance passivation layer 152 acts as an etch stop). In other embodiments suitable etch stop layers could be inserted at other points in the stack (e.g. in the thickness direction 505) so as to control the extent in the thickness direction of any such recess 166.

Such a recess 166 in the laminate of passivation layers 150 is advantageous for substantially reducing the inhibitive effects of the passivation layer on the displacement of the electrical element during operation.

Figure 3C:
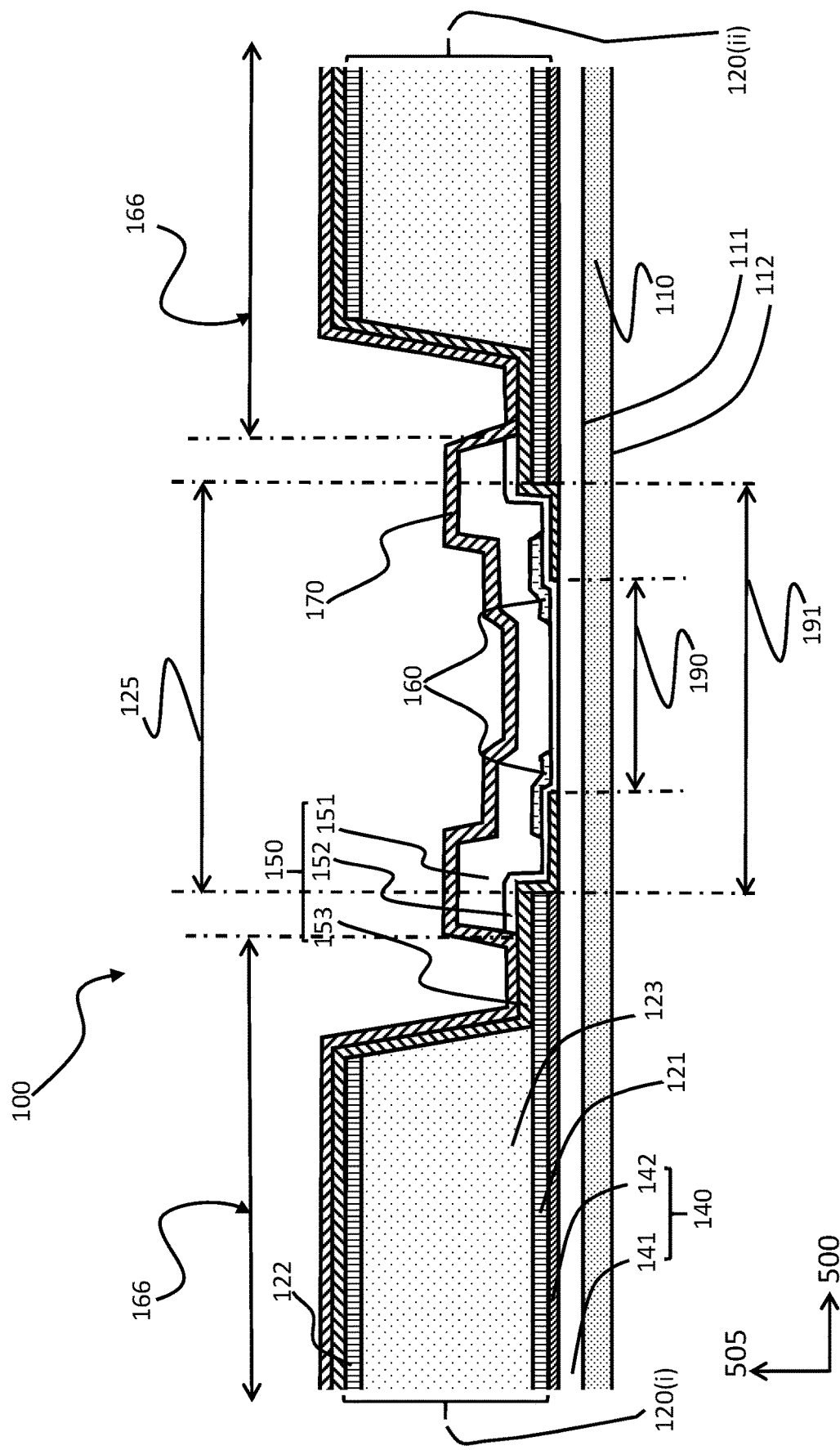

In some embodiments a recess in a laminate of passivation layers may extend in the width direction 500 to include the whole of the top surface and at least part, preferably all of the lateral surface of each of the one or more electrical elements. This configuration is especially advantageous for reducing any inhibitive effects of the passivation layer on the displacement of the electrical element during operation. An exemplar embodiment of the above described implementation is depicted in FIG. 3(c), showing a schematic diagram of a cross-section through a portion of an electrical component according to another embodiment of the disclosure where there is a discontinuous region 190 in the innermost layer of the laminate passivation layer 150 and an alternative arrangement of recess 166 over the electrical elements. A suitably shaped mask and an etch step, as would be understood by one skilled in the art, may be used to remove all of outermost passivation layer 151 and middle passivation layer 152 over the electrical element 120 at this particular cross-section whilst retaining these layers over the electrical traces 160. It may be understood that at other cross-sections in the direction 510, where the electrical traces 160 extend over the electrical element 120 so as to provide an electrical connection to the second electrode 122, the shape of the mask may be altered in this region so as to retain the outermost passivation layer 151 and middle passivation layer 152 over the electrical traces 160 and over the appropriate portion of the electrical element 120. In the embodiment depicted in FIG. 3(c) the innermost passivation layer 153 has been retained over the electrical element 120 so as to provide passivation between the first electrode 121 and the second electrode 122.

In further alternative embodiments, the recess 166 as shown in FIG. 3(c) may additionally be accompanied by a window (not shown in FIG. 3(c)) in the one or more innermost layers of the passivation 150 in a region overlying the top surface of each of the one or more electrical elements. The window may be required in order to increase the displacement of the electrical element.

Finally, in FIG. 2(o), a continuous insulating layer 170 is deposited over the entire exposed surface of the stack in the thickness direction 505. The insulation layer is, for example, a stack of silica and tantala layers deposited on top of each other in a thickness direction 505 by atomic layer deposition to a total thickness of 20 nm.

The layer 170 covers any recess or discontinuities present in the underlying passivation layer or laminate of passivation layers overlying each of the one or more electrical elements, as well as any discontinuities present in the intermediate regions, as described above. Moreover the insulating layer 170 can substantially plug or mend any point defects present in the underlying passivation layer or outermost layer of a laminate of passivation layers so that each of the one or more electrical elements and the electrical component as a whole are effectively protected from the external environment.

Figure 5:
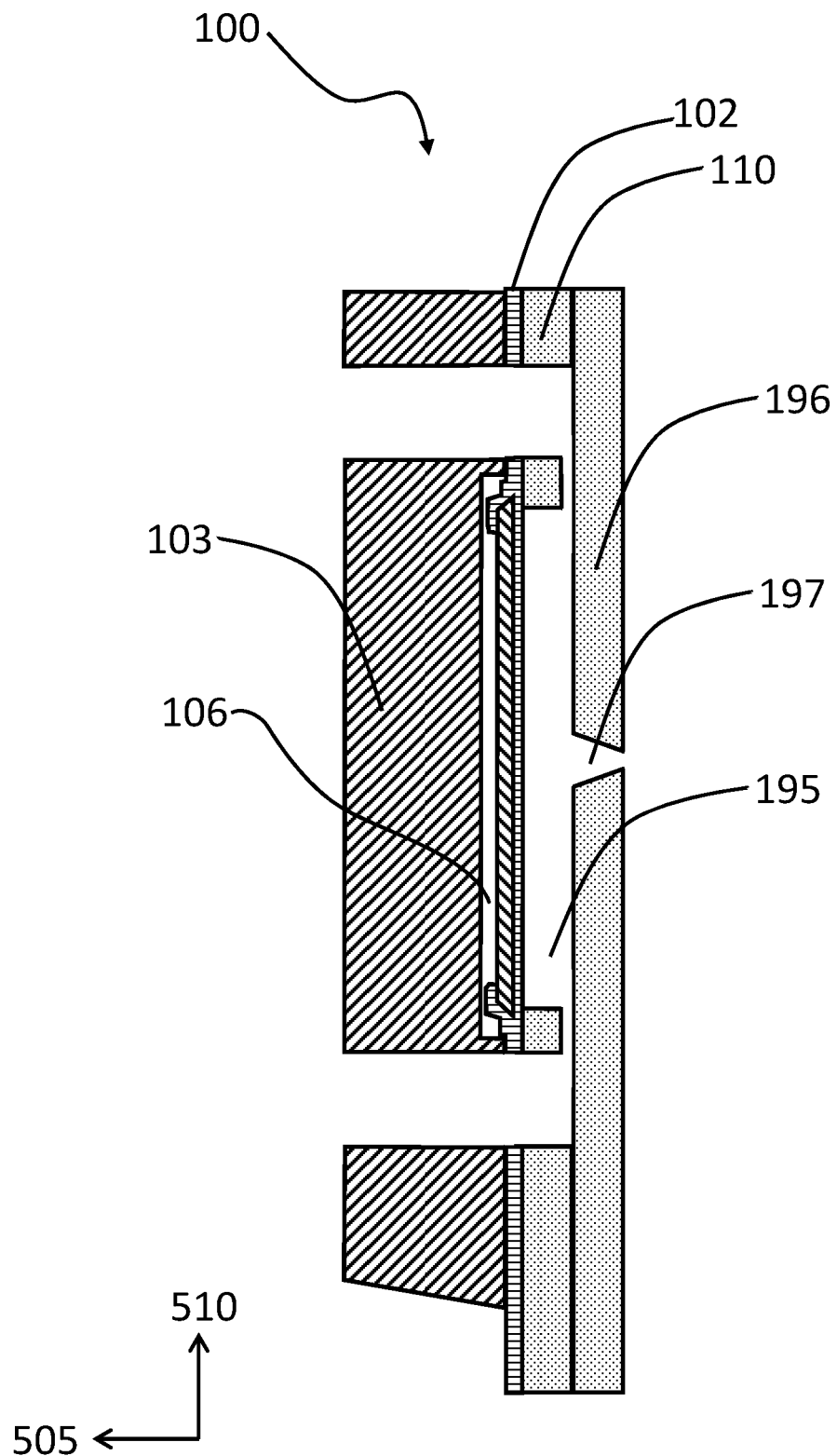
FIG. 5 is a cross section of a droplet ejection head according to an embodiment of the disclosure.

After the deposition of the insulation layer 170, a capping layer 103 may be bonded to the electrical component on the insulation layer 170 so that a cavity 106 encloses the electrical element 102, as shown in FIG. 1(a) and FIG. 5.

It may be understood by one skilled in the art, that additional manufacturing steps may occur in between the stages depicted in FIGS. 2(a)-(o) so as to create other components in other locations of the substrate layer 110 and that some of these steps may be omitted or split into several sub-steps as may be required.

The formation of a discontinuity in the passivation layer or laminate of passivation layers in the intermediate region between neighbouring electrical elements will now be discussed with reference to FIG. 3(a). FIG. 3(a) is a schematic diagram of a cross-section through part of an electrical component 100 and shows portions of two adjacent electrical elements 120(i) and (ii), in the width direction 500, within the component 100, where the component 100 comprises a plurality of electrical elements 120 (which may be arranged in a row or in an array of rows on or overlying the substrate layer 110).

As seen in FIG. 3(a), each electrical element 120(i) is separated from a neighbouring electrical element 120(ii) by an intermediate region 125 in the width direction 500. It will be understood by the skilled person that an electrical component 100 may contain a plurality of electrical elements 120(i to n) all separated by a plurality of intermediate regions 125(i to n−1).

The innermost passivation layer 153 of the laminate of passivation layers 150, which is disposed adjacent the underlying electrical elements 120, has a discontinuous region 190 in the width direction 500, which overlies the intermediate region 125 between neighbouring electrical elements 120(i) and 120(ii) of the electrical component 100. It may be understood that in other embodiments, all layers 151-153 of the laminate of passivation layers 150, may each have a coincident discontinuous region 190, over at least one intermediate region 125 between neighbouring electrical elements 120. It may also be understood that the discontinuous regions 190 may also be not coincident. An example of the latter implementation is shown in FIG. 3(b) where the passivation layers 153 and 152 have respective discontinuities 190(i) and 190(ii) in the intermediate region 125.

FIG. 3(a)-(c) also illustrate an electrical component comprising a laminate of intermediate layers 140 which is disposed adjacent to the first side 111 of the substrate layer 110. The laminate of intermediate layers 140 is located between the substrate layer 110 and the electrical element 120. The laminate of intermediate layers 140 comprises a continuous layer 141 and a discontinuous intermediate layer 142. The intermediate layer 142 is at least partially interposed between the electrical element 120 and the substrate layer 110, where the intermediate layer 142 lies above the first side 111 of the substrate layer 110 in the thickness direction 505; wherein the intermediate layer 142 has a discontinuous region 191 over at least one intermediate region 125 between neighbouring electrical elements 120(i) and 120(ii) of the electrical component 100.

In some embodiments the passivation layer 150, or at least the innermost passivation layer 153 of the laminate of passivation layers 150, is discontinuous over the majority of the intermediate region 125 between neighbouring electrical elements 120, such that the discontinuous region 190 covers a majority of the intermediate region 125 in the width direction 500. Furthermore, in some embodiments the intermediate layer 142 is discontinuous over the majority, preferably all, of the intermediate region 125 between neighbouring electrical elements 120, such that the discontinuous region 191 covers a majority, or all, of the intermediate region 125 in the width direction 500.

It will be understood that in some embodiments the electrical component has a passivation layer 150, or at least the innermost first passivation layer 153 of the laminate of passivation layers 150, which includes a discontinuous region (e.g. in the form of one or more holes/apertures)

overlying only a minority of the intermediate region 125 between neighbouring electrical elements 120.

It will be further understood that in some embodiments where the passivation layer 150 comprises a laminate of passivation layers 150, all layers of the laminate of passivation layers 150 may be discontinuous over the majority of the intermediate regions 125 between neighbouring electrical elements 120, such that the majority of the intermediate regions between neighbouring electrical elements 120 have areas where there are no overlying passivation layers. In other embodiments where the electrical component 100 comprises a laminate of multiple passivation layers 150 only the innermost first passivation layer 153 of the laminate of passivation layers 150 is discontinuous over the intermediate regions 125 between neighbouring electrical elements 120, such that one or more other layers of the laminate overlie the intermediate regions 125 between electrical elements 120 where the innermost layer, first passivation layer 153, of the laminate does not. In other embodiments the laminate of multiple passivation layers 150 may comprise layers that are discontinuous in the width direction 500 to differing extents. In some embodiments, (see FIG. 3(b)) the innermost passivation layer 153 closest to the electrical element 120 in the thickness direction 505 may have the longest discontinuous region 190(i) that is the closest in length to the intermediate region 125 in the width direction 500.

Providing discontinuous regions 190, 191 allows isolation of failed electrical elements to avoid cascading failures which are particularly prevalent where the composition of the passivation layer 150 (or the innermost layer of a laminate of multiple passivation layers 150) or the composition of an underlying intermediate layer 142 is/are more susceptible to moisture/chemical attack but where such a material is otherwise useful to use in the construction of the electrical component 100. For example alumina is such a material that is useful for the passivation layer 150 or for the innermost layer of a laminate of multiple passivation layers 150. Alumina is likewise useful for the composition of an underlying intermediate layer 142. If an individual electrical element 120 fails, then it can be compensated for (e.g. by adjusting waveform to adjacent functioning electrical elements 120) to extend the device lifetime.

Figure 4:
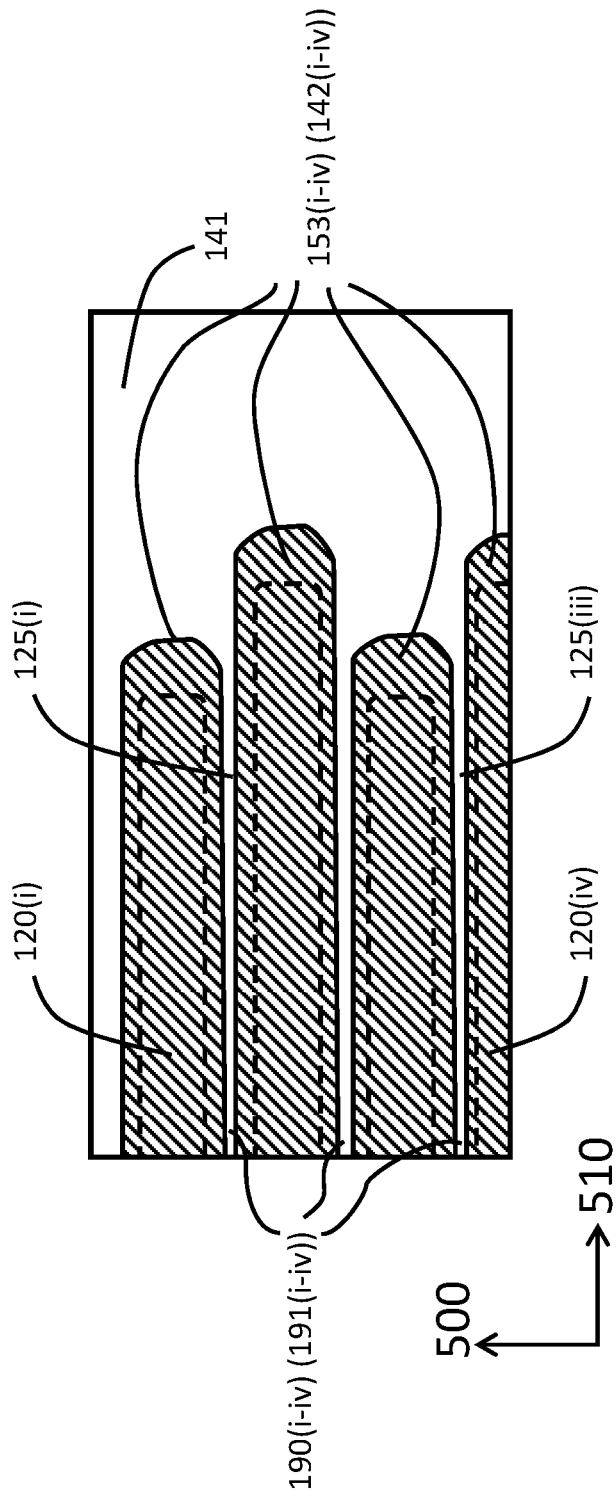
FIG. 4 depicts a top view of a portion of a row of electrical elements of an electrical component according to the disclosure.

It will be understood that when one or more discontinuities 190 or 191 are required in order to prevent cascading failures of the electrical elements of an electrical component, the corresponding layer or layers, namely passivation layers and/or intermediate layers as described above, are segmented into isolated regions wherein each electrical element 120 of the plurality of electrical elements is provided with an isolated region of the segmented layer or layers as shown, in a simplified form, in a top view of a portion of a row of electrical elements 120, in FIG. 4. It will be understood that any segmented 142 layer would lie below each electrical element hence it would not be visible from the top view depicted in FIG. 4. Nevertheless the general shape of the segmented 142 layer will resemble that of the segmented passivation layer 153 shown in FIG. 4. It will also be understood that other rows of electrical elements may be included in the electrical component adjacent to the row shown in FIG. 4, in the 510 direction.

As it can be noted from FIGS. 3(a)-(c), the continuous insulating layer or laminate of insulating layers 170 overlies the electrical elements 120(i) and (ii) and in particular any discontinuities in the underlying passivation layer or laminate of passivation layers in order to strengthen the passivation of the electrical elements by mending the point defects that might be present in the passivation layer or the outermost layer of the laminate of passivation layers, including any damage or defects caused by over-etching any of the passivation layers during the various process steps. As it can be further noticed, the insulating layer or laminate of insulating layers 170 overlies also any discontinuities 190 and/or 191 present in any intermediate region 125 located between any neighbouring electrical elements 120(i) and 120(ii) of the plurality of electrical elements 120 of the electrical component 100.

FIG. 5 shows a cross-section of a droplet ejection head according to an embodiment of the fourth aspect of the invention where a fluidic chamber 195 has been formed by etching in the substrate 101, below the electrical element 120 in the thickness direction 505.

A nozzle plate 196 is provided at the side of the fluidic chamber opposite to the side on which the electrical element is formed, in the thickness direction 505. A nozzle 197 is formed in the nozzle plate to allow ejection of fluid droplets from the fluidic chamber 195. A capping layer 103 defines a cavity 106 for the electrical element 120. Such cavity may be sealed in a fluid-tight manner so as to prevent fluid within the fluidic chamber 195 and inlet passageways and outlet passageways at the sides of the fluidic chamber 195 in the direction 510 from entering the cavity.

The invention claimed is:
1. An insulated electrical component for a microelectromechanical systems device comprising:
   i) a substrate layer comprising first and second sides spaced apart in a thickness direction;
   ii) one or more electrical elements arranged over the first side of the substrate layer, wherein each of the one or more electrical elements comprises:
      a) a ceramic member; and
      b) first and second electrodes disposed adjacent the ceramic member such that a potential difference may be established between the first and second electrodes and through the ceramic member during operation;
   iii) a continuous insulating layer, or laminate of insulating layers, arranged to overlie each of the one or more electrical elements arranged on the first side of the substrate layer; and
   iv) a passivation layer, or laminate of multiple passivation layers, disposed adjacent to, and at least partially overlying, each of the one or more electrical elements so as to provide electrical passivation between the first and second electrodes of each of the one or more electrical elements, such that said passivation layer, or said laminate of multiple passivation layers, electrically insulates the first and second electrodes from each other; wherein:
      the passivation layer, or at least an innermost layer of the laminate of multiple passivation layers which is disposed adjacent each of the one or more underlying electrical elements, is discontinuous.

2. The electrical component according to claim 1, wherein the insulating layer, or laminate of insulating layers, are selected from one or more layers of silica, hafnia, zirconia, tantala, and combinations thereof.

3. The electrical component according to claim 2, wherein the electrical component comprises a laminate of insulating layers including a plurality of silica layers, wherein a silica layer is arranged so as to be adjacent to the electrical element, and wherein the laminate further comprises a plurality of tantala layers.

4. The electrical component according to claim 1, wherein the insulating layer, or laminate of insulating layers, at least partially fills any discontinuities or defects in the underlying passivation layer.

5. The electrical component according to claim 1, wherein the passivation layer, or at least one layer of a laminate of passivation layers which is disposed adjacent the underlying electrical element, is discontinuous in a region overlying each of the one or more electrical elements.

6. The electrical component according to claim 1, wherein the electrical component comprises a plurality of adjacent electrical elements and wherein the passivation layer, or at least the innermost layer of the laminate of passivation layers which is disposed adjacent each underlying electrical element, is discontinuous over at least one intermediate region between neighboring electrical elements of the electrical component.

7. The electrical component according to claim 1, wherein the electrical component comprises a plurality of adjacent electrical elements and wherein electrical component comprises at least one intermediate layer interposing the electrical elements and substrate, where the at least one intermediate layer is discontinuous over at least one intermediate region between neighboring electrical elements of the electrical component.

8. The electrical component according to claim 1, wherein the electrical component comprises a plurality of adjacent electrical elements and wherein electrical component comprises at least one intermediate layer interposing the electrical elements and substrate, where the at least one intermediate layer comprises hafnia and is adjacent to the electrical elements of the electrical component.

9. The electrical component according to claim 1, wherein the passivation layer, or laminate of passivation layers, is recessed at a side which faces away from each of the underlying electrical elements, wherein a recess is provided in a region overlying each of the one or more electrical elements, such that the passivation layer, or laminate of passivation layers, is thinner in a thickness direction across the recess compared to other non-recessed regions of the passivation layer, or laminate of passivation layers.

10. The electrical component according to claim 1, wherein the electrical component comprises a laminate of multiple passivation layers disposed adjacent to the ceramic member and first and second electrodes of each of the one or more electrical elements, wherein the composition of an innermost layer of the laminate which is disposed adjacent to the one or more electrical elements differs from the composition of at least one other layer of the laminate.

11. The electrical component according to claim 1, wherein the ceramic member and first and second electrodes of each of the one or more electrical elements are arranged in a stack of layers, each having lateral surfaces extending in a thickness direction, wherein the ceramic member has a first side and an opposing second side spaced apart in a thickness direction, wherein the first side of the ceramic member faces the substrate layer and the first electrode is disposed adjacent the first side of the ceramic member so as to interpose the substrate layer and the ceramic member; wherein the second electrode is disposed adjacent to the second side of the ceramic member; and wherein the passivation layer, or laminate of multiple passivation layers, at least partially overlies the second electrode and is disposed adjacent to the lateral surfaces of the ceramic member and those of the first and second electrodes of each of the one or more electrical elements.

12. The electrical component according to claim 1, wherein the first and second electrodes of each of the one or more electrical elements are interdigitated electrodes.

13. The electrical component according to claim 1, wherein the electrical component comprises a laminate of multiple passivation layers disposed adjacent to the ceramic member and first and second electrodes of each electrical element, wherein: i) the innermost layer of the laminate which is disposed adjacent the ceramic member and first and second electrodes comprises at least one of alumina, zirconia, a combination of silica and tantala and hafnia, and ii) wherein at least one other layers of the laminate comprises at least one of silica and silicon nitride.

14. The electrical component according to claim 1, wherein the electrical component comprises a laminate of multiple passivation layers and wherein the electrical component comprises electrical traces which connect the first and second electrodes of at least one electrical element to drive circuitry, wherein the electrical traces are at least partially interposed between two adjacent layers of the laminate of multiple passivation layers, which two layers do not include the innermost passivation layer disposed adjacent the ceramic member and first and second electrodes and one or more additional passivation layers; wherein the innermost passivation layer of the laminate comprises at least one of alumina, zirconia, silica, tantala and hafnia and wherein the two adjacent passivation layers between which the electrical traces are interposed each comprises at least one of silica and silicon nitride.

15. The electrical component according to claim 1, wherein the insulated electrical component is an actuator component for use in a droplet ejection apparatus.

16. The electrical component according to claim 1, incorporated in a droplet ejection head.

17. The electrical component according to claim 1, incorporated in a droplet ejection head of a droplet ejection apparatus.

18. An insulated electrical component for a microelectromechanical systems device comprising:
  i) a substrate layer comprising first and second sides spaced apart in a thickness direction;
  ii) one or more electrical elements arranged over the first side of the substrate layer, wherein each of the one or more electrical elements comprises:
    a) a ceramic member; and
    b) first and second electrodes disposed adjacent the ceramic member such that a potential difference may be established between the first and second electrodes and through the ceramic member during operation;
  iii) a continuous insulating layer, or laminate of insulating layers, arranged to overlie each of the one or more electrical elements arranged on the first side of the substrate layer; and
  iv) a laminate of multiple passivation layers disposed adjacent to, and at least partially overlying, each of the one or more electrical elements so as to provide electrical passivation between the first and second electrodes of each of the one or more electrical elements, such that said laminate of multiple passivation layers electrically insulates the first and second electrodes from each other; wherein:
  the laminate of multiple passivation layers is recessed at a side which faces away from each of the underlying electrical elements, wherein a recess is provided in a region overlying each of the one or more electrical elements, such that the laminate of passivation layers is thinner in a thickness direction across the recess compared to other non-recessed regions of the laminate of passivation layers.

19. The electrical component according to claim 18, incorporated in a droplet ejection head.

20. The electrical component according to claim 18, incorporated in a droplet ejection head of a droplet ejection apparatus.

* * * * *